(12) United States Patent
Hayashi et al.

(10) Patent No.: US 12,287,926 B2
(45) Date of Patent: Apr. 29, 2025

(54) SENSOR DEVICE

(71) Applicant: Fujikura Ltd., Tokyo (JP)

(72) Inventors: Eriko Hayashi, Tokyo (JP); Makoto Takamatsu, Sakura (JP); Yasuyuki Tachikawa, Tokyo (JP); Takashi Kameshima, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 17/638,008

(22) PCT Filed: Aug. 28, 2019

(86) PCT No.: PCT/JP2019/033725
§ 371 (c)(1),
(2) Date: Feb. 24, 2022

(87) PCT Pub. No.: WO2021/038757
PCT Pub. Date: Mar. 4, 2021

(65) Prior Publication Data
US 2022/0276732 A1    Sep. 1, 2022

(51) Int. Cl.
*G06F 3/0354* (2013.01)
*G06F 3/02* (2006.01)
(Continued)

(52) U.S. Cl.
CPC ........ *G06F 3/03547* (2013.01); *G06F 3/0202* (2013.01); *G06F 3/04146* (2019.05); *H01H 36/0033* (2013.01)

(58) Field of Classification Search
CPC .. H03K 17/955; H03K 17/98; H03K 17/9622; H03K 2217/960765;
(Continued)

(56) References Cited

U.S. PATENT DOCUMENTS

2006/0012944 A1* 1/2006 Mamigonians ........ G06K 7/081
361/303
2010/0230181 A1* 9/2010 Suzuki ................. H03K 17/962
178/18.06
(Continued)

FOREIGN PATENT DOCUMENTS

JP    2005-537610 A    12/2005
JP    2007-520120 A     7/2007
(Continued)

OTHER PUBLICATIONS

International Search Report dated Nov. 19, 2019, issued in counterpart International Application No. PCT/JP2019/033725, w/English Translation. (5 pages).

*Primary Examiner* — Jimmy H Nguyen
(74) *Attorney, Agent, or Firm* — WHDA, LLP

(57) ABSTRACT

A sensor device 1A includes: an insulating substrate 11; a touch sensor TS that includes a sensor electrode 12 disposed on a first surface 15a disposed on an operation surface side; a shield electrode 131 disposed on the first surface 15a; and a detecting electrode 14 facing the shield electrode 131 and disposed on a second surface 15b different from the first surface 15a. The first surface 15a is located closer to the operation surface than the second surface 15b, the shield electrode 131 and the detecting electrode 14 constitute a pressure-sensitive sensor that detects a change in capacitance value caused by approaching of the shield electrode 131 and the detecting electrode 14, and the shield electrode 131 blocks capacitive coupling between an operator FIN and the detecting electrode 14 caused by approaching of the operator FIN to the operation surface.

15 Claims, 17 Drawing Sheets

(51) Int. Cl.
*G06F 3/041* (2006.01)
*H01H 36/00* (2006.01)

(58) Field of Classification Search
CPC . H03K 2217/96054; H03K 2217/9651; H03K 2217/9653; H01H 36/0033; G06F 3/04146; G06F 3/03547; G06F 3/0202; G06F 3/044; G06F 2203/04107; G06F 2203/04105
USPC .......................................................... 345/173
See application file for complete search history.

(56) References Cited

U.S. PATENT DOCUMENTS

| | | | |
|---|---|---|---|
| 2011/0057899 A1* | 3/2011 | Sleeman | G01L 1/146 |
| | | | 345/174 |
| 2011/0157087 A1 | 6/2011 | Kanehira et al. | |
| 2011/0175845 A1 | 7/2011 | Honda et al. | |
| 2021/0199472 A1* | 7/2021 | Kobayashi | H03K 17/962 |

FOREIGN PATENT DOCUMENTS

| | | |
|---|---|---|
| JP | 2009-32570 A | 2/2009 |
| JP | 2010-217967 A | 9/2010 |
| JP | 5446626 B2 | 3/2014 |
| JP | 2017-215953 A | 12/2017 |
| WO | 2004/040606 A2 | 5/2004 |
| WO | 2016/016612 A1 | 2/2016 |
| WO | 2018/108475 A1 | 6/2018 |
| WO | 2019/230634 A1 | 12/2019 |

\* cited by examiner

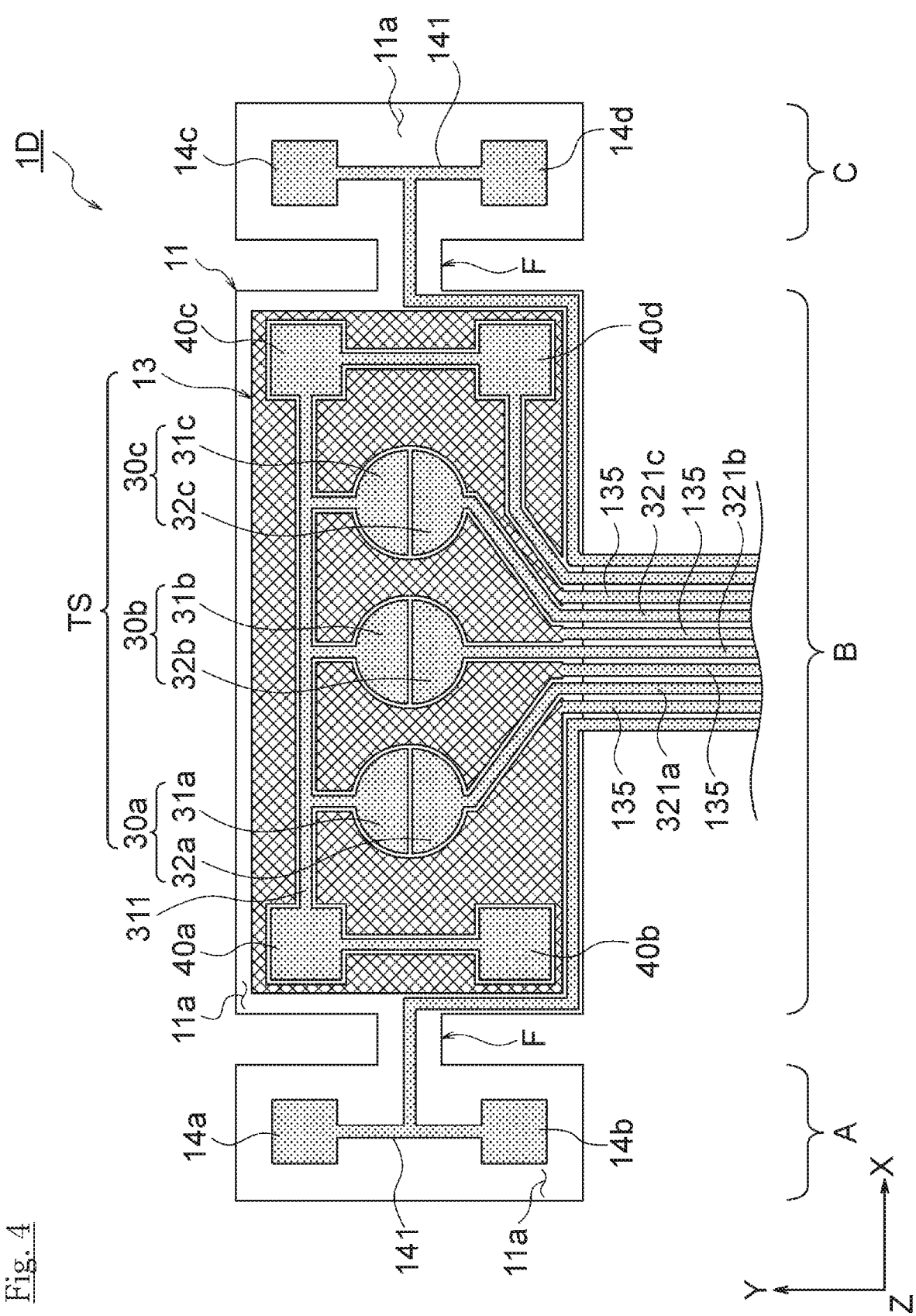

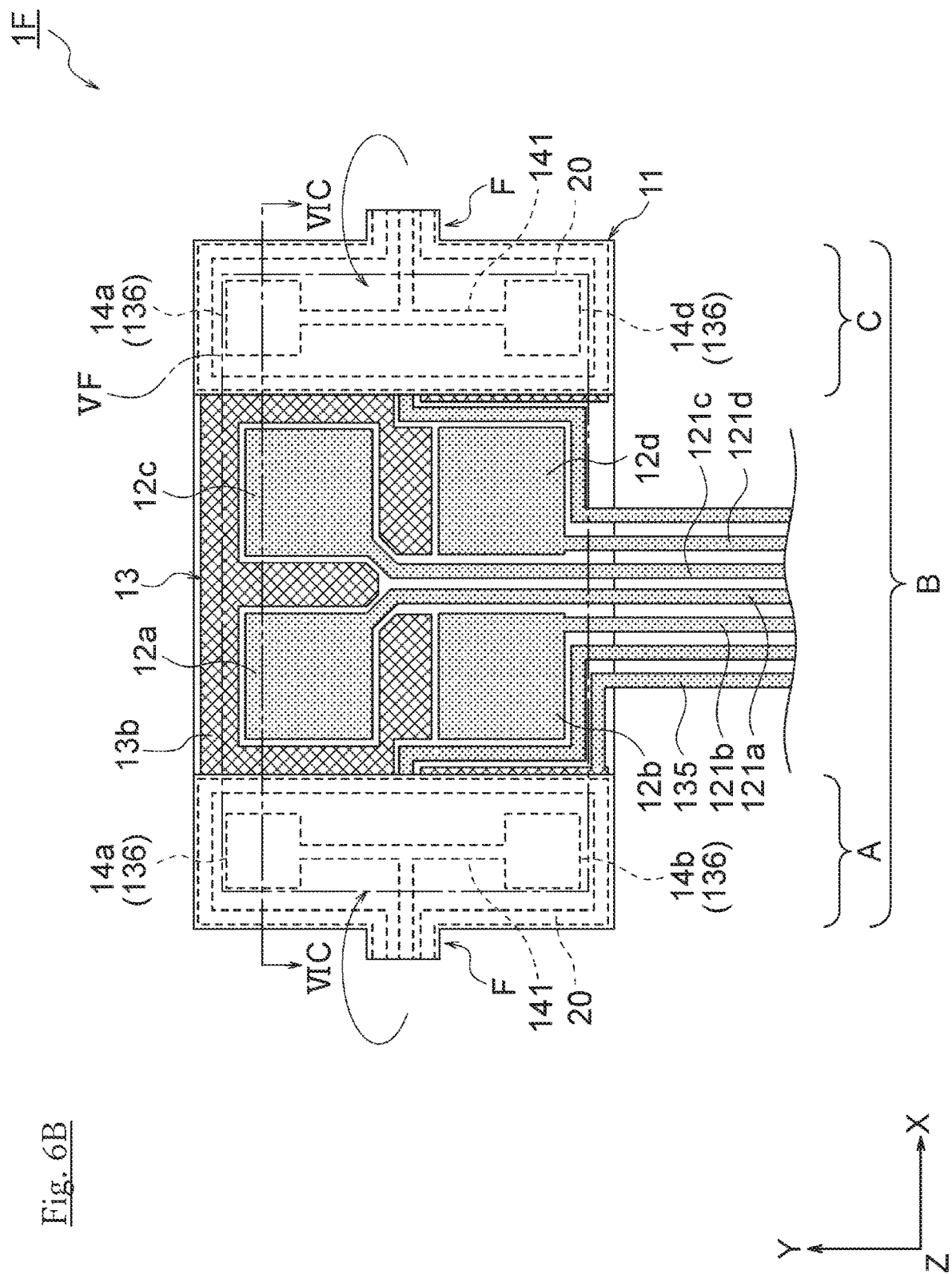

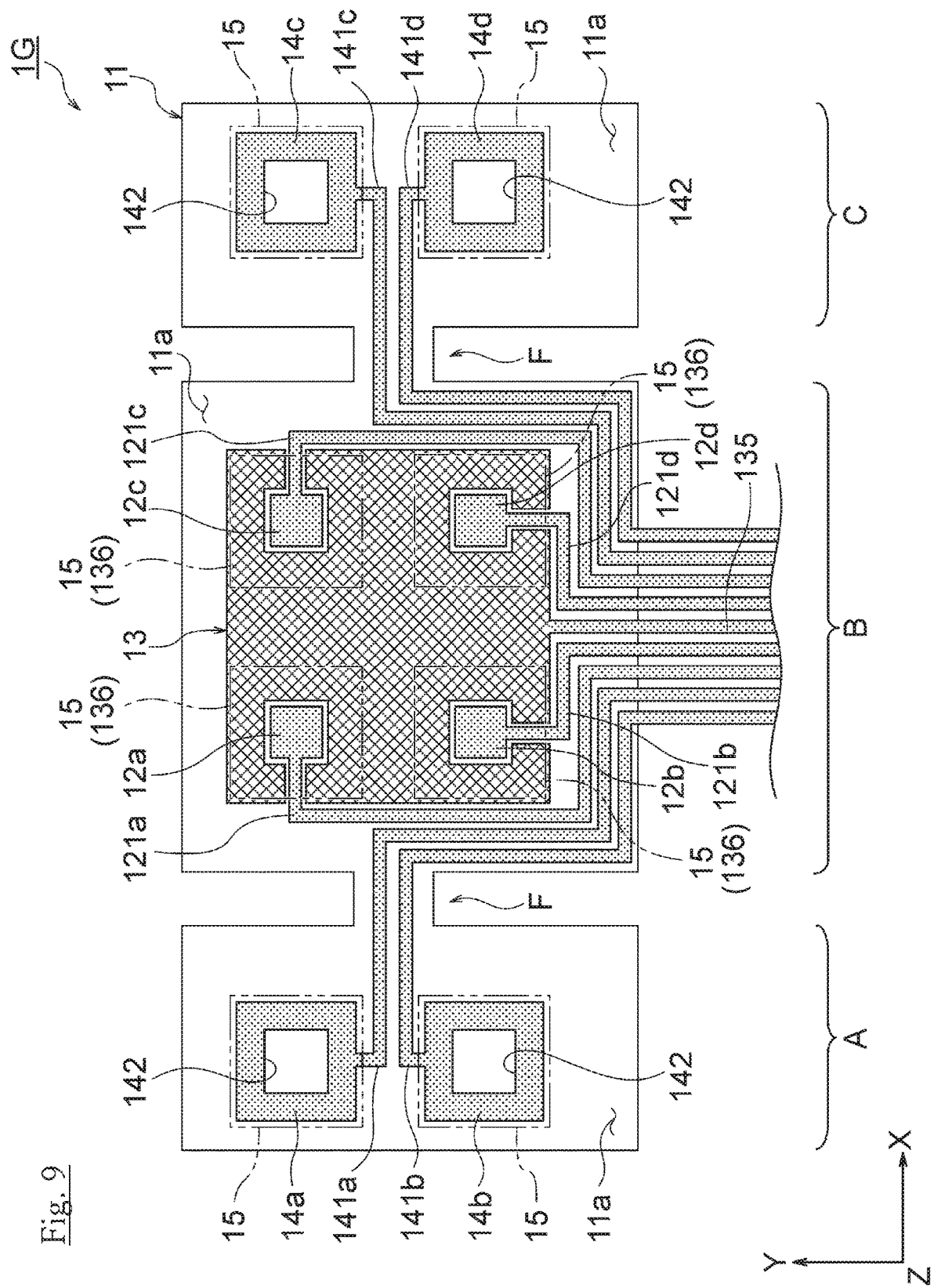

SENSOR DEVICE

TECHNICAL FIELD

The present invention relates to a sensor device that includes a touch sensor and a pressure-sensitive sensor.

BACKGROUND ART

In a touch panel including a pressure-sensitive sensor that detects changes in capacitance in response to the pressing deformation, a technique is known (for example, see Patent Document 1), the technique is to prevent erroneous detection of the pressure-sensitive sensor by disposing a conductive vapor deposition film (blocking body) on the lower surface of the top plate in order to block the capacitive coupling (electrostatic coupling) caused by approaching the operator such as a finger.

CITATION LIST

Patent Document

Patent Document 1: JP 5446626 B

SUMMARY OF THE INVENTION

Problem to be Solved by the Invention

In this technique, since the conductive vapor deposition film is provided independently of the touch panel and the pressure sensitive sensor, the number of components of the sensor device is increased. As a result, the total thickness of the product is increased, and the cost of the product is increased.

A problem to be solved by the present invention is to provide a sensor device capable of suppressing the occurrence of erroneous detection of a pressure-sensitive sensor without increasing the number of parts of the sensor device.

Means for Solving Problem

[1] A sensor device according to the invention is a sensor device including: an insulating substrate; a touch sensor that includes a sensor electrode formed on one main surface of the insulating substrate and disposed on a first surface disposed on an operation surface side; a blocking body that is disposed on the first surface; and a detecting electrode that is disposed to face the blocking body and is disposed on a second surface different from the first surface, in which the first surface is located closer to the operation surface than the second surface, the blocking body and the detecting electrode constitute a pressure-sensitive sensor that detects a change in capacitance value caused by approaching of the blocking body and the detecting electrode, the blocking body blocks capacitive coupling between an operator and the detecting electrode caused by approaching of the operator to the operation surface.

[2] In the above invention, the touch sensor may further comprise a first shield portion that is disposed on the first surface, at least a part of the first shield portion may be formed in at least a part of a periphery of the sensor electrode, and the blocking body may be included in the first shield portion.

[3] In the above invention, the sensor electrode may include an input electrode and a receiving electrode that are arranged to be adjacent to each other.

[4] In the above invention, the blocking body may be connected to the input electrode or may be included in the input electrode.

[5] In the above invention, the blocking body may be configured to have substantially the same potential as the potential of the input electrode in a state where the sensor device is connected to an external circuit device.

[6] In the above invention, the sensor device may further comprise a spacer that keeps a space between the blocking body and the detecting electrode, and the blocking body and the detecting electrode may be accessible to each other in response to a pressing of the operator.

[7] In the above invention, the spacer may be an elastic body that is disposed between the blocking body and the detecting electrode.

[8] In the above invention, the spacer may have an opening that is interposed between the blocking body and the detecting electrode.

[9] In the above invention, the blocking body may cover the detecting electrode in a plan view.

[10] In the above invention, the detecting electrode may be filled with a conductive material.

[11] In the above invention, the sensor device may further comprise a second shield portion that is formed on at least a part of a periphery of the detecting electrode.

[12] In the above invention, the detecting electrode may be formed at a position outside the sensor electrode and the blocking body and interposing a predetermined region in the insulating substrate, and the detecting electrode may be disposed to face the blocking body by bending the predetermined region.

[13] In the above invention, the touch sensor may comprise a plurality of the sensor electrodes, the sensor device may comprise a plurality of the detecting electrodes, and the plurality of detecting electrodes may be arranged around the plurality of sensor electrodes in a plan view.

[14] In the above invention, the plurality of sensor electrodes may be disposed inside a virtual frame that encompasses the plurality of detecting electrodes and that contacts the plurality of detecting electrodes in a plan view.

[15] In the above invention, the touch sensor may comprise a plurality of the sensor electrodes, the sensor device may comprise a plurality of the detecting electrodes, and the plurality of detecting electrodes may be arranged to respectively correspond to the plurality of sensor electrodes in a plan view.

[16] In the above invention, the detecting electrode may surround at least a part of the sensor electrode in a plan view.

[17] In the above invention, the sensor device may comprise a plurality of the blocking bodies that are disposed to respectively correspond to the sensor electrodes.

[18] In the above invention, each of the sensor electrodes may include an input electrode and a receiving electrode that are arranged to be adjacent to each other, the detecting electrode may face the input electrode, and the blocking body may be included in the input electrode.

[19] In the above invention, the touch sensor may comprise a first shield portion that has a slit extending linearly, and the sensor device may comprise a lead wiring that is connected to the detecting electrode and passes the first shield portion through the slit.

Effect of the Invention

According to the present invention, since the capacitive coupling between the operator and the detecting electrode caused by approaching of the operator to the operation surface is blocked by the blocking body, it is possible to suppress the occurrence of erroneous detection of the pressure-sensitive sensor. Further, in the present invention, since the blocking body is utilized as one electrode of the pressure-sensitive sensor, it is not necessary to newly provide an independent blocking body from the pressure-sensitive sensor and the touch sensor, and the number of components of the sensor device is not increased.

BRIEF DESCRIPTION OF DRAWINGS

FIG. 2B is a cross-sectional view of the sensor device taken along IIB-IIB line of FIG. 2A;

FIG. 4 is an expansion plan view illustrating the sensor device in the fourth embodiment of the present invention;

FIG. 6B is a plan view illustrating a state in which the regions A and C of the sensor device shown in FIG. 6A are bent;

FIG. 9 is an expansion plan view illustrating the sensor device in the seventh embodiment of the present invention;

MODE(S) FOR CARRYING OUT THE INVENTION

First Embodiment

The sensor device 1A in the present embodiment can be applied to operation switches, touch panel displays and the like of electronic devices such as car navigation systems, air conditioners, and audio devices mounted on vehicles The sensor device 1A may be used for applications other than in-vehicle use.

Figure 1A:
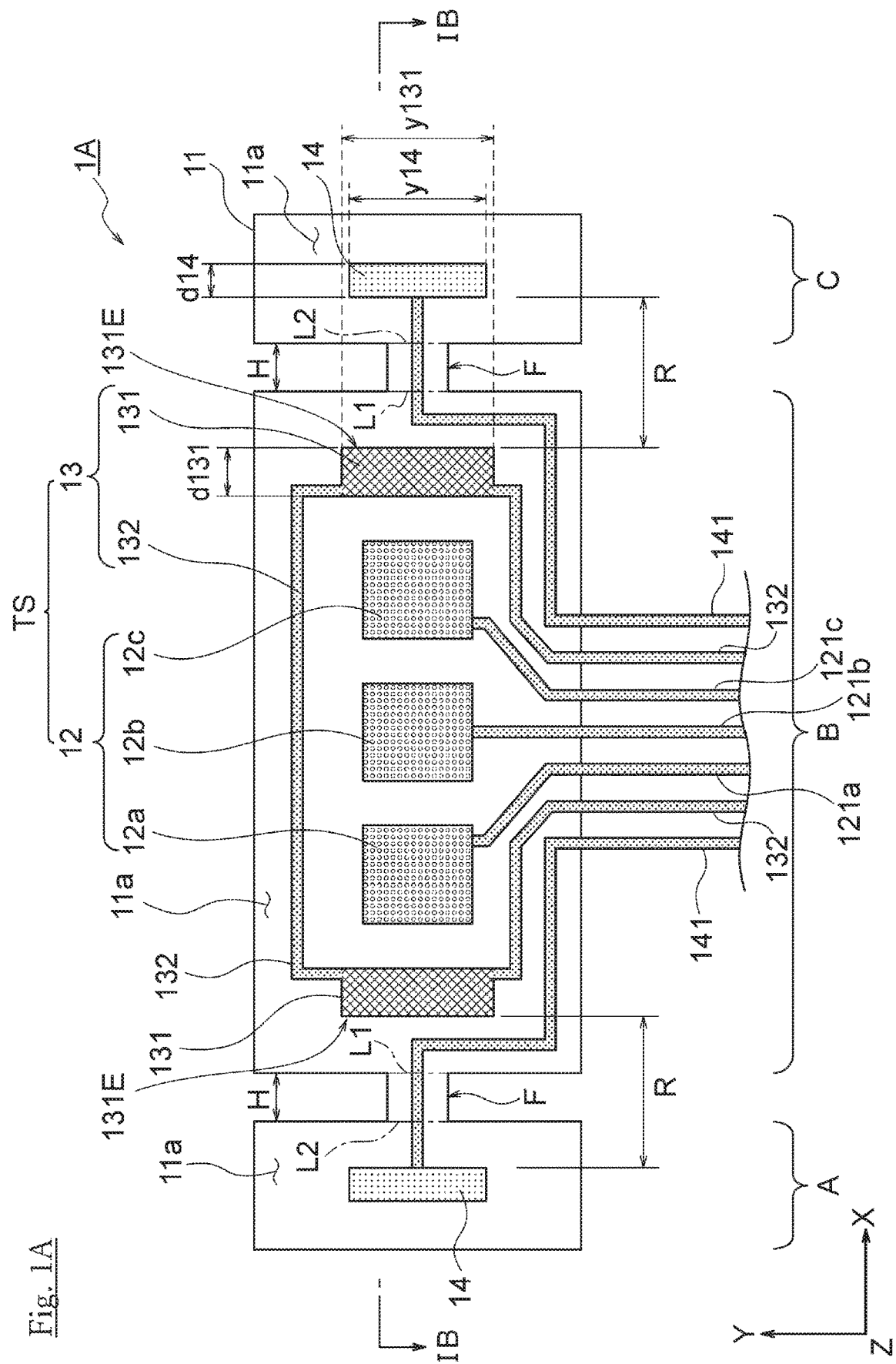
FIG. 1A is an expansion plan view illustrating the sensor device in the first embodiment of the present invention.
Figure 1B:
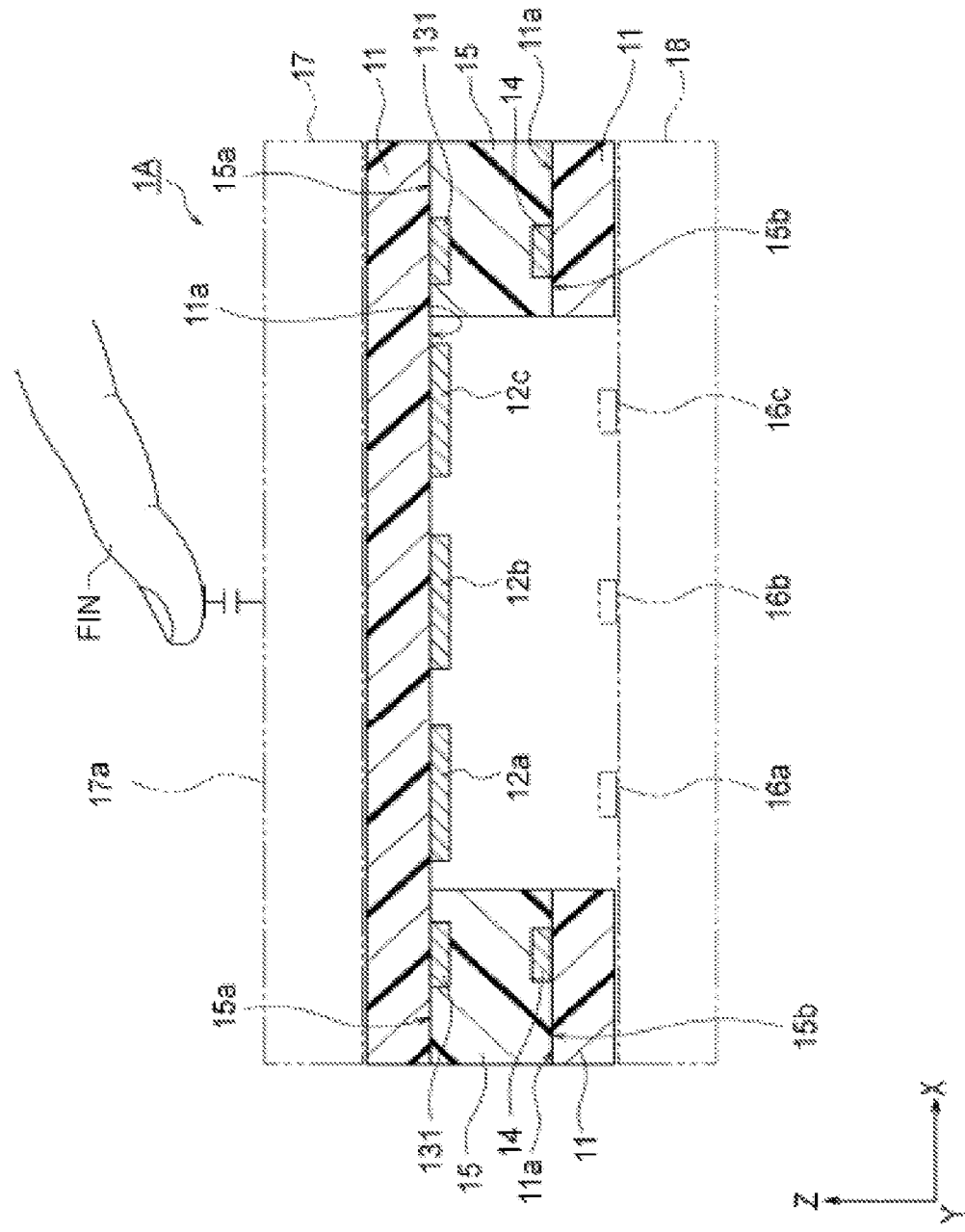
FIG. 1B is a cross-sectional view of the sensor device taken along IB-IB line of FIG. 1A.

Hereinafter, the configuration of the sensor device 1A will be described with reference to FIG. 1A and FIG. 1B. FIG. 1A is an expansion plan view illustrating the sensor device 1A in the first embodiment of the present invention, and FIG. 1B is a cross-sectional view of the sensor device 1A assembled from the unfolded state shown in FIG. 1A taken along IB-IB line.

As shown in FIG. 1A, the sensor device 1A includes an insulating substrate 11, sensor electrodes 12 (12a, 12b, 12c), first shield portions 13 (131, 132), detecting electrodes 14, and spacers 15.

The present embodiment shown in the figure is an example, and the arrangement, number, and shape of the sensor electrodes 12 (12a, 12b, 12c), the first shield portions 13 (131, 132), and the detecting electrodes 14 are not limited. For example, an example in which the number of detecting electrodes 14 is two is shown in the figure, however the number of detecting electrodes 14 may be one or three or more, and the number of the detecting electrodes 14 may be three to match with the number of the sensor electrodes 12. Alternatively, the detecting electrodes 14 may be arranged to correspond to the four corners of the insulating substrate 11, and the number of the detecting electrodes 14 may be four. Further, the sensor device 1A may include an electrode pattern (for example, a slider electrode, a wheel electrode, or the like) other than the sensor electrode 12 and the detecting electrode 14 on the insulating substrate 11.

The insulating substrate 11 in the present embodiment has regions A to C along the X direction in the figure (horizontal direction in the figure). In the sensor device 1A shown in FIG. 1A, the sensor electrode 12 and the first shield portion 13 are formed in the region B, and the detecting electrode 14 is formed in each of the regions A and C. Although the first shield portion 13 in the present embodiment is disposed around the sensor electrode 12, the first shield portion 13 may extend between the sensor electrodes 12a, 12b, and 12c (see FIG. 2A). As shown in the expansion plan view of FIG. 1A, the sensor electrode 12, the first shield portion 13, and the detecting electrode 14 are formed on the same main surface 11a of the insulating substrate 11.

In the example shown in FIG. 1A, the sensor device 1A in which the X direction in the figure coincides with the longitudinal direction of the sensor device 1A is described as an example, however the sensor device 1A may be manufactured so that the Y direction in the figure coincides with the longitudinal direction of the sensor device 1A. Further, the sensor electrode 12 and the first shield portion 13 may be formed on one main surface of the insulating substrate 11, and the detecting electrode 14 may be formed on the other main surface of the insulating substrate.

In the sensor device 1A of the present embodiment, the sensor electrode 12 and the first shield portion 13 form a touch sensor TS, and the shield electrode 131 and the detecting electrode 14 form a pressure-sensitive sensor. The shield electrode 131 forming the pressure-sensitive sensor is also a part of the first shield portion 13 forming the touch sensor TS. In the present embodiment, the shield electrode 131 that is a part of the first shield portion 13 in the touch sensor TS also serves as a function of an electrode forming a pair with the detecting electrode 14 of the pressure sensor.

The sensor device 1A shown in FIG. 1A has a predetermined region R between the region A and the region B, that is, at the connecting portion where the region A and the region B are connected. Similarly, the sensor device 1A has a predetermined region R between the region B and the region C, that is, at the connecting portion where the region B and the region C are connected.

Each of the two predetermined regions R includes a bent portion F. The area A is bent toward the area B side. The bent portion F of the present embodiment includes two bending lines L1 and L2 extending along the Y axis and disposed at different positions along the X axis. The region A on the left side in the figure is fold along the bending line L1 and/or L2, or at the vicinity of the bending line L1 or L2, along the Y axis (on the Y axis as a center). Since the insulating substrate 11 is in the form of a thin sheet having flexibility, the bent portion F is in the form of a curved surface shape.

By this folding operation, the folded region A has a positional relationship substantially parallel to the region B, the region A and the region B overlap each other, and the detecting electrode 14 formed in the region A and the shield electrode 131 are arranged to face each other. Similarly, the region C is also folded so that the region C overlaps the region B. By the folding operation, the folded area C has a positional relationship substantially parallel to the region B, the region C and the region B overlap each other, and the detecting electrode 14 formed in the region C and the shield electrode 131 are arranged to face each other. The sensor device 1A is assembles by such folding actions. A cross-section of the assembled sensor device 1A is shown in FIG. 1B.

As shown in FIG. 1B, in the assembled sensor device 1A, the sensor electrode 12 and the first shield portion 13 are disposed (formed) on the first surface 15a. The first surface 15a is arranged on the operation surface side, and the operation surface is a surface on which an input operation or the like is performed to the sensor device 1A. On the other hand, the detecting electrode 14 is disposed (formed) on the second surface 15b. The second surface 15b is located at the position from the operation surface side in the −Z direction (the lower side in the figure when the upper side in the figure is defined as the +Z direction) with respect to the first surface 15a, and the operation surface is a surface where the operator FIN such as a finger approaches or contacts. Therefore, the first surface 15a is located closer to the operation surface than the second surface 15b.

Here, the operation surface side indicates a position that is closer (closer side) to the operation surface 17a on which an input operation is performed by approaching or contacting of an operator FIN including a human body such as a finger in the sensor device 1A. The first surface 15a and the second surface 15b are different in position (height) in the thickness direction of the sensor device 1A shown as the Z direction in the figure. The position of the first surface 15a is closer to the operation surface than the position of the second surface 15b.

The first surface 15a and the second surface 15b are virtual planes parallel to the XY plane in the sensor device 1A. In the present embodiment, for convenience of explanation, an example is shown in which the positions of the first surface 15a and the second surface 15b are provided with reference to the positions of the front and back surfaces of the spacer 15. However, the reference for setting the positions of the first surface 15a and the second surface 15b is not particularly limited to the front and back surfaces of the spacer 15. For example, the setting positions for the first surface 15a and the second surface 15b may be defined with reference to the position of one main surface or the other main surface of the insulating substrate 11. Alternatively, the setting positions for the first surface 15a and the second surface 15b may be defined with reference to the position of one main surface or the other main surface of the other member provided along the spacer 15 or the insulating substrate 11. The first surface 15a and the second surface 15b in the present embodiment are surfaces along the XY surface of any of the members constituting the sensor device 1A and have different Z coordinate values.

In the sensor device 1A, as long as the first surface 15a is located closer to the operation surface than the second surface 15b, the method of forming the first surface 15a and the second surface 15b is not limited. For example, the first surface 15a and the second surface 15b may be formed by forming the sensor electrode 12 and the first shield portion 13 in the region B of one main surface of the insulating substrate 11, forming the detecting electrodes 14 in the regions A and C of one main surface of the insulating substrate 11 as shown in FIG. 1A, and bending the insulating substrate 11 so that the insulating substrate 11 does not interpose between the sensor electrode 12 and the detecting electrode 14 and between the first shield portion 13 and the detecting electrode 14 as shown in FIG. 1B.

Alternatively, although not particularly shown, the first surface 15a and the second surface 15b may be formed by bending the insulating substrate 11 to the opposite side so that the insulating substrate 11 is interposed on the detecting electrode 14 side of the sensor electrode 12 and the first shield portion 13 and on the sensor electrode 12 side and the first shield portion 13 side of the detecting electrode 14. Even in this case, the operation surface, the touch sensor TS (first surface 15a) including the sensor electrode 12, and the detecting electrode 14 (second surface 15b) are arranged in order along the Z-axis direction with reference to the operation surface in the figure.

Further, the first surface 15a and the second surface 15b may be formed on main surfaces of different insulating substrates 11. That is, the insulating substrate 11 on which the sensor electrode 12 and the first shield portion 13 are formed and the insulating substrate 11 on which the detecting electrode 14 is formed may be different substrates.

The bent portion F of the sensor device 1A shown in FIG. 1A is formed by cutting out a region of the insulating substrate 11 along the Y-axis direction in the figure. That is, the length of the bent portion F along the Y-axis direction (the length in the direction perpendicular to H in the figure) is formed to be shorter than the length of the region A along the Y-axis direction. The length of the bent portion F along the Y-axis direction is the length along the bending line.

Since the flexibility of the insulating substrate 11 is reduced at the bent portion F by making the length of the bent portion F along the Y-axis direction shorter than the length of the region A in the Y-axis direction, it is possible to easily bent the insulating substrate 11 and to simplify the bending work (assembly work of the sensor device 1A). Further, since the elastic force applied to the bent portion F is reduced after the insulating substrate 11 is bent, it is possible to easily maintain the parallelism between the first surface 15a and the second surface 15b. The length H of the bent portion F along the X-axis direction shown in FIG. 1A is preferably equal to or greater than the distance between the region B and the region A (the distance between the region C and the region B) at the time of assembly.

As shown in FIG. 1B, the cover panel 17 may be disposed on the surface (operation surface/input surface) of the sensor device 1A. The cover panel 17 is preferably made of a transparent material such as polycarbonate, acrylic substrate, or glass.

Further, although not particularly limited, the base member 18 may be disposed at a position (lower side in the drawing) opposite to the arrangement position of the cover panel 17 of the sensor device 1A. The base member 18 may be in contact with the sensor device 1A to support the sensor device 1A, or may be separated from the sensor device 1A. The base member 18 is a sheet-like member such as polyethylene terephthalate (PET), polyimide (PI), liquid crystal polymer (LCP), glass epoxy or polyethylene naphthalate (PEN). LEDs 16a, 16b, 16c as light emitters may be disposed on the surface of the base member 18 on the insulating substrate 11 side.

As shown in FIG. 1B, a signal (operation command) is output when the operator FIN touches the cover panel 17. As a specific example of the operator FIN, a finger, a touch pen, or the like can be exemplified. The cover panel 17 and the base member 18 can be adhered to the sensor device 1A by using an adhesive or an adhesive tape. Although not particularly limited, as the material of the adhesive or the adhesive tape, an acrylic resin-based material, a urethane resin-based material, an epoxy resin-based material, a silicone resin-based material, or the like can be used. When the adhesive is applied to the cover panel 17, the base member 18, or the sensor device 1A, these can be adhered by heat-curing, ultraviolet-curing, or heat-melting the adhesive.

As an aspect of the touch sensor TS including the sensor electrode 12, a touch switch can be exemplified. As another aspect of the touch sensor TS including the sensor electrode 12, a touch panel can be exemplified instead of a touch switch.

As shown in FIG. 1B, the main surface 11a of the region B of the insulating substrate 11 is disposed to face the lower side (the direction opposite to the cover panel 17), and the main surfaces 11a of the bent region A and the region C are disposed to face the upper side (the direction toward the cover panel 17 side). The sensor electrodes 12a, 12b, 12c formed on the main surface 11a of the region B detect a change in capacitance between the sensor electrodes 12a, 12b, 12c and the operator FIN. The sensor electrodes 12a, 12b, 12c have the same functions as the electrodes of a general capacitance sensor of the self-capacitance type.

Hereinafter, the components of the sensor device 1A will be described.

The insulating substrate 11 is a sheet-like substrate such as polyethylene terephthalate (PET), polyimide (PI), liquid crystal polymer (LCP) or polyethylene naphthalate (PEN). In the present embodiment, polyethylene terephthalate (PET) having high transparency and flexibility is used. The thickness of the insulating substrate 11 may be any thickness, however may be 10 [μm] to 200 [μm] in consideration of bendability.

As shown in FIG. 1A, the sensor electrode 12, the first shield portion 13 and the detecting electrode 14 of the present embodiment is formed on the same main surface 11a of the insulating substrate 11. The sensor electrode 12, the first shield portion 13 and the detecting electrode 14 of the present embodiment may be respectively formed on different main surfaces of the insulating substrate 11. For example, the sensor electrode 12 and the first shield portion 13 are formed on one main surface of the insulating substrate 11, and the detecting electrode 14 may be formed on the other main surface of the insulating substrate 11.

The sensor electrode 12, the first shield portion 13 and the detecting electrode 14 are formed of a conductive material such as silver, copper, carbon. The sensor electrode 12, the first shield portion 13 and the detecting electrode 14 can be formed by using a method known at the time of filing including a printing method such as screen printing or gravure offset printing, or a subtractive method or an additive method (which may be either a full additive method or a semi-additive method), or the like. In the present embodiment, since the sensor electrode 12, the first shield portion 13 and the detecting electrode 14 are formed on the same main surface 11a of the insulating substrate 11, it is possible to simultaneously form them by a single manufacturing process.

The sensor electrode 12 includes a first sensor electrode 12a, a second sensor electrode 12b, and a third sensor electrode 12c. Each of the first sensor electrode 12a, the second sensor electrode 12b and the third sensor electrode 12c is a capacitance sensor of the self-capacitance type and detects a change in capacitance. The lead wiring 121a connected to the first sensor electrode 12a, the lead wiring 121b connected to the second sensor electrode 12b, and the lead wiring 121c connected to the third sensor electrode 12c are connected to an external circuit device.

The first shield portion 13 of the present embodiment is formed in at least a part of the periphery of the sensor electrode 12 on one main surface 11a of the insulating base material 11. The number of the shield electrodes 131 disposed around the sensor electrode 12 is not limited. The shield electrodes 131 disposed around the sensor electrodes 12 may be discretely arranged or may be arranged to surround the sensor electrodes 12. The first shield portion 13 is connected to the ground or a constant potential.

The first shield portion 13 includes a shield electrode 131 and a shield wiring 132 connected to the shield electrode 131. The shield wiring 132 is drawn to the outside and is connected to the ground or a constant potential. In the example shown in FIG. 1A, the shield electrode 131 and the shield wiring 132 are disposed to surround the sensor electrode 12. The first shield portion 13 eliminates noise so that the capacitance between the sensor electrode 12 and the operator FIN can be accurately detected. Thus, it is possible to prevent erroneous detection due to capacitive coupling with a conductor other than the operator FIN that is close to the touch sensor TS.

The first shield portion 13 of the present embodiment is disposed around the sensor electrode 12, however the aspect of the first shield portion 13 is not limited. For example, the first shield portion 13 may include a shield wiring 133, 134 (see FIG. 2A) extending between the first to third sensor electrodes 12a, 12b, 12c. In this case, a detecting electrode 14 may be disposed to face the shield wiring 133, 134, and the shield wiring 133, 134 functions as a shield electrode forming a pair with the detecting electrode 14 of the pressure-sensitive sensor.

Further, in the example shown in FIG. 1A, the linear shield wiring 132 is provided, however the shape of the shield wiring 132 is not limited to linear shape. The first shield portion 13 other than the shield electrode 131 functions as a shield wiring regardless of its aspect and shape. For example, although not shown, the first shield portion 13 may be arranged two-dimensionally to fill the entire periphery of each of a first sensor electrode 12a, a second sensor electrode 12b and the third sensor electrode 12c and the margin of the insulating substrate 11. In this case, all the locations (regions) other than the shield electrode 131 are shield wiring.

The first shield portion 13 may be formed of a conductive material such as silver, copper, or carbon. The shield electrodes 131 are preferably formed in a mesh shape as shown in FIG. 1A. The shield wiring 132 may also be formed in a mesh shape. By forming the shield electrode 131 in a mesh shape, it is possible to accurately detect the input operation of the operator FIN to the sensor electrode 12.

Here, the sensor electrode 12 detects the contact of the operator FIN by detecting the change in capacitance generated between the sensor electrode 12 and the dielectric body existing in its circumference including the first shield portion 13. If the shield electrode 131 included in the first shield portion 13 has a filled (solid) pattern instead of a mesh pattern, the capacitive coupling between the sensor electrode 12 and the first shield portion 13 is too large, so it is difficult to detect with high accuracy the change in capacitance value caused by approaching of the operator FIN.

On the other hand, in the present embodiment, the capacitance coupling between the sensor electrode 12 and the shield electrode 131 is reduced by forming the shield electrode 131 in a mesh shape, and it is possible to detect with high accuracy the change in the capacitance value due to the approach of the operator FIN. Further, the capacitance coupling between the sensor electrode 12 and the shield wiring 132 is reduced by forming the shield wiring 132 in a mesh shape, and it is possible to detect with even higher accuracy the change in the capacitance value due to the approach of the operator FIN.

As described above, the first shield portion 13 includes the shield electrode 131. The shield electrode 131 of the present embodiment not only functions as a shield, but also has a function to form a pressure-sensitive sensor (described later) by forming a pair with the detecting electrode 14. It is possible to form another sensor (pressure-sensitive sensor described later) between the first shield portion 13 and the detecting electrode 14 by providing the shield electrode 131 in the first shield portion 13.

Similar to the sensor electrode 12, the detecting electrode 14 of the present embodiment is formed on the main surface 11a of the insulating substrate 11. Further, the detecting electrode 14 is formed outside the first shield portion 13. The outer position may be in the X direction in the figure or in the Y direction in the figure. In the present embodiment, the detecting electrode 14 is formed at a position where a predetermined region R is interposed from the outer edge 131E of the shield electrode 131 along the X direction in the figure. The outer edge 131E of the shield electrode 131 is located outside the center (the position where the second sensor electrode 12b is formed in the present embodiment) along the X direction in the figure of the first shield portion 13. The lead wiring 141 connected to the detecting electrode 14 is connected to the external circuit device, and the output signal of the detecting electrode 14 is output to the circuit device.

The detecting electrode 14 of the present embodiment may be formed on another main surface different from one main surface of the insulating substrate 11 on which the sensor electrode 12 and the first shield portion 13 are formed. Alternatively, the detecting electrode 14 may be formed on an insulating substrate 11 different from the insulating substrate 11 on which the sensor electrode 12 and the first shield portion 13 are formed.

The detecting electrode 14 of the present embodiment is formed by being painted and filled with a conductive material such as silver, carbon, or copper. The detecting electrode 14 is formed as a so-called solid electrode. Instead of the solid pattern, the detecting electrode 14 may be formed in a mesh shape. It is possible to improve the detection accuracy of the pressure-sensitive sensor by forming the paired shield electrodes 131 in a mesh shape and forming the detecting electrode 14 in a filled state (non-mesh shape).

As described above, since the sensor electrode 12 detects the contact of the operator FIN by detecting the change in capacitance generated between the sensor electrode 12 and the dielectric body existing in its circumference including the first shield portion 13, it is also an idea to form the detecting electrode 14 in a mesh shape in order to reduce the capacitive coupling. However, from the viewpoint of improving the accuracy of the pressure-sensitive sensor, there is also an advantage in obtaining a large value of the capacitance between the shield electrode 131 and the detecting electrode 14. Therefore, it is possible to increase the capacitance and to improve the detection sensitivity of the pressure sensor by forming the detecting electrode 14 filled with a conductive material (so-called solid pattern).

Next, the function of the sensor device 1A of the present embodiment will be described. The sensor device 1A of the present embodiment includes a touch sensor TS formed by the sensor electrode 12, and a pressure-sensitive sensor formed by the detecting electrode 14 and the shield electrode 131.

The touch sensor TS is formed by the sensor electrodes 12 (12a, 12b, 12c). As described above, this touch sensor TS is a self-capacitance type capacitance sensor. When the operator FIN comes into contact with the sensor electrode 12, a new capacitance is added to a constant capacitance (parasitic capacitance) between the sensor electrode 12 and the ground, and the touch sensor TS detects the contact of the operator FIN by detecting that capacitance change. The touch sensor TS outputs a change value (Diff value) of the capacitance as a result of detection by the sensor electrodes 12a, 12b, 12. The first shield portion 13 including the shield electrode 131 and the shield wiring 132 eliminates noise and improves the detection accuracy of the sensor electrode 12.

The pressure-sensitive sensor is formed by the detecting electrode 14 and the shield electrode 131. The pressure-sensitive sensor detects a change in capacitance between the detecting electrode 14 and the shield electrode 131. The pressure-sensitive sensor outputs a change value (Diff value) of the capacitance as a result of detection by the detecting electrode 14. The change value of the capacitance output by the pressure-sensitive sensor is the capacitance value that is changed as the detecting electrode 14 and the shield electrode 131 are relatively close to each other in response to the pressing force of the operator FIN that performs the input operation. When the change value of the capacitance detected by the pressure-sensitive sensor is equal to or greater than a predetermined value, it can be determined that the input operation involves a pressing force equal to or greater than a predetermined value.

The sensor device 1A of the present embodiment includes not only the touch sensor TS formed by the sensor electrode 12 operated by the operator FIN and the first shield portion 13 but also a pressure-sensitive sensor formed by a shield electrode 131 and a detecting electrode 14 by using the shield electrode 131 of the first shield portion 13 as a part of the pressure-sensitive sensor.

Therefore, not only the signal of whether or not the user (operator) has touched the operation surface of the sensor device 1A and the signal of the plane position of the contacted operation surface are obtained from the touch sensor TS, but also it is possible to determine that the signal is intentionally input by the user according to the signal output from the pressure sensor. For example, when the output value of the pressure sensor is equal to or greater than a predetermined value, it is possible to determined that the output value of the touch sensor TS is an operation based on the user's intention, and the output value of the pressure sensor is less than the predetermined value, it is possible to determine that the output value of the touch sensor TS is not an operation based on the user's intention but an unintended contact.

As described above, the sensor device 1A of the present embodiment can determine (extract) the input signal by the operation based on the user's intention from all the output signals. That is, it is possible to determine (exclude) that the signal caused by unintentionally touching the touch panel is not an input signal. As a result, the sensor device 1A of the present embodiment can prevent erroneous detection due to an input not intended by the user.

In the present embodiment, as shown in FIG. 1B, the shield electrode 131 of the first shield portion 13 and the detecting electrode 14 are arranged in parallel along the XY plane, and the positions of at least a part of the regions on the XY plane are common/overlap with each other. The Z coordinate value of the shield electrode 131 (position in the height/thickness direction in the figure) and the Z coordinate value of the detecting electrode 14 (position in the height/thickness direction in the figure) are different from each other. The shield electrode 131 of the first shield portion 13 and the detecting electrode 14 are arranged to face each other.

In the present embodiment, the first shield portion 13 fulfills the shielding function of the touch sensor TS, and the shield electrode 131 that is a part of the first shield portion 13 is paired with the detecting electrode 14 to fulfill the function as an electrode of the pressure-sensitive sensor (pressure sensor).

Further, the first surface 15a on which the first shield portion 13 including the shield electrode 131 is provided is disposed closer to the cover panel 17 which is the operation surface of the sensor device 1A than the second surface 15b on which the detecting electrode 14 is provided. As a result, it is possible to block the capacitive coupling between the operator FIN and the detecting electrode 14, and the shield electrode 131 functions as a blocking body for preventing erroneous detection of the pressure-sensitive sensor due to the approach of the operator FIN.

As described above, in the present embodiment, a blocking body is not added as a separate member, and the shield electrode 131 that functions as one electrode of the pressure-sensitive sensor (pressure sensor) functions as the blocking body. Therefore, it is not necessary to provide a blocking body independent of the pressure-sensitive sensor (pressure sensor). Since the shield electrode 131 functions both as one electrode of the pressure-sensitive sensor (pressure sensor) and as a blocking body, it is possible to suppress the increase in the number of parts. Therefore, it is possible to reduce the total thickness of the sensor device 1A and to suppress the cost increase of the sensor device 1A.

As shown in the figure, the spacer 15 is disposed between the shield electrode 131 and the detecting electrode 14. In the pressure-sensitive sensor, the detecting electrode 14 disposed to face the shield electrode 131 via the spacer 15 detects a change in capacitance in response to the deformation of the spacer 15 due to pressing in the Z-axis direction. The surface of the spacer 15 on the first surface 15a side is in contact with the shield electrode 131, and the opposite surface of the spacer 15 on the second surface 15b side is in contact with the detecting electrode 14.

The spacer 15 is an elastic body made of an elastic material. Although not particularly limited, an elastic body made of cushion foam such as urethane or silicone can be used as the spacer 15. In the present embodiment, foamed silicone having good temperature characteristics is used as the spacer 15. In the present embodiment, from the viewpoint of ensuring the translucency of the portion of the sensor electrode 12, the spacer 15 is not disposed in the region where the sensor electrode 12 is formed.

Further, the shield electrode 131 is formed to cover the detecting electrode 14. The region in the XY coordinates of the shield electrode 131 (see FIG. 1A and FIG. 1B) belongs to the region in the XY coordinates of the detecting electrode 14 (see FIG. 1A and FIG. 1B). As shown in the figure, the shield electrode 131 is not in contact with the detecting electrode 14. Further, it is preferable that the width d131 (width in the X direction) of the shield electrode 131 included in the first shield portion 13 is thicker (the value of the width length is larger) than the width d14 (width in the X direction) of the detecting electrode 14 (d131>d14). Similarly, in the Y direction in the figure, it is preferable that the length y131 (length in the Y direction) of the shield electrode 131 is longer (the value of the width length is larger) than the length y14 (length in the Y direction) of the detecting electrode 14 (y131>y14).

In the present embodiment, the shape, size and position (position at the time of assembly) of the shield electrode 131 and the detecting electrode 14 are set so that the width in the X direction of the shield electrode 131 is larger than the width in the X direction of the detecting electrode 14 and the width in the Y direction of the shield electrode 131 is larger than the width in the Y direction of the detecting electrode 14. Therefore, in the plan view, the XY area where the shield electrode 131 exist includes the XY region where the detecting electrode 14 exists, and the shield electrode 131 covers the detecting electrode 14.

Since the detecting electrode 14 does not have a portion exposed from the shield electrode 131 in a plan view by covering the detecting electrode 14 with the shield electrode 131 in the XY plane in the figure, it is possible to more reliably prevent the electrostatic coupling between the operator FIN and the detecting electrode 14. Furthermore, since the shield electrode 131 is larger than the detecting electrode 14 while the shield electrode 131 covers the detecting electrode 14, even when the operator FIN is close to a position that does not overlap the detecting electrode, it is possible to prevent the electrostatic coupling between the operation element FIN and the detecting electrode 14 in the oblique direction.

Second Embodiment

The sensor device 1B of the second embodiment is different from that of the first embodiment in that (a) the insulating substrate 11 has a region D instead of the region C, and (b) the second blocking body 20 is provided. The basic configuration of the sensor device 1B of the second embodiment is the same as the basic configuration of the sensor device 1A of the first embodiment. Hereinafter, only differences between the sensor device 1B in the second embodiment and the first embodiment will be described, and portions having the same configurations as those in the first embodiment will be denoted by the same reference numerals, and descriptions thereof will be omitted.

Figure 2A:
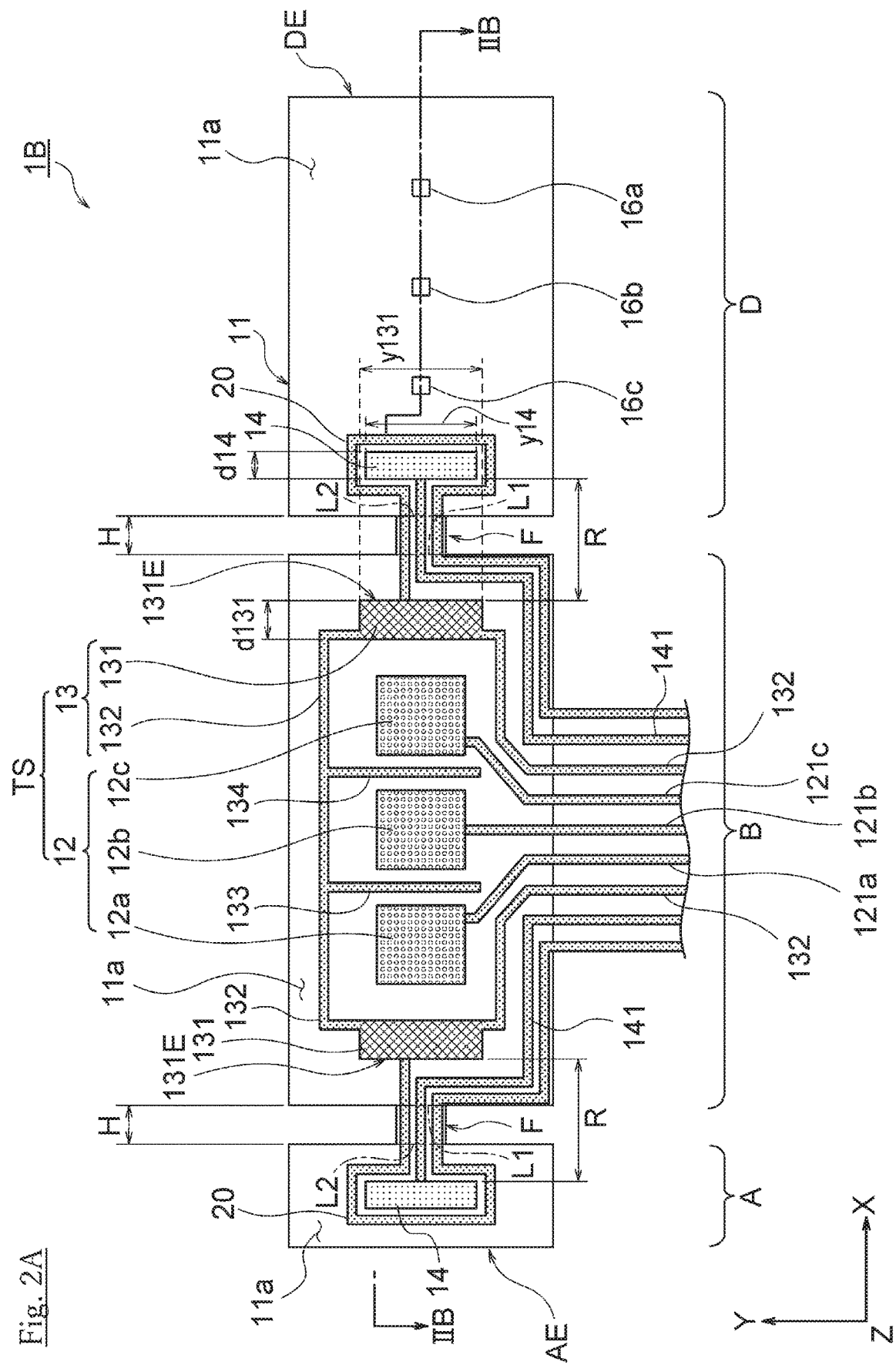
FIG. 2A is an expansion plan view illustrating the sensor device in the second embodiment of the present invention.

The sensor device 1B of the second embodiment will be described with reference to FIG. 2A and FIG. 2B. FIG. 2A is an expansion plan view of the sensor device 1B in the second embodiment of the present invention, and FIG. 2B is a cross-sectional view of the sensor device 1B assembled from the unfolded state shown in FIG. 2A taken along IIB-IIB line.

As shown in FIG. 2A, the sensor device 1B includes an insulating substrate 11, sensor electrodes 12 (12a, 12b, 12c), first shield portions 13 (131, 132, 133, 134), and detecting electrodes 14, second shield portions 20 and spacers 15.

The first shield portion 13 of the present embodiment is disposed around the sensor electrode 12 and includes shield wiring 133, 134 (see FIG. 2A) extending between the sensor electrodes 12a, 12b, and 12c. Although not particularly shown, the detecting electrode 14 may be disposed to face the shield wirings 133 and 134. In this case, the shield wirings 133 and 134 fulfill a function as the shield wiring of the touch sensor TS, a function as the electrode paired with the detecting electrode 14 of the pressure-sensitive sensor, and a function as a blocking body of the detecting electrode.

The second shield portion 20 of the present embodiment is disposed on the same second surface 15*b* as the surface on which the detecting electrode 14 is disposed and is disposed in at least a part of the periphery of the detecting electrode 14. In the examples shown in FIG. 2A and FIG. 2B, the second shield portion 20 is disposed to surround the detecting electrode 14. The second shield portion 20 is drawn to the outside and is connected to the ground or a constant potential. In the example shown in FIG. 2A, the second shield portion 20 is connected to the shield electrode 131 of the first shield portion 13. The second shield portion 20 may not be connected to the first shield portion 13 as long as it is drawn to the outside and is connected to the ground or a constant potential.

As shown in FIG. 2B, in the assembled sensor device 1B, the sensor electrode 12 and the first shield portion 13 are disposed (formed) on the first surface 15*a* on the operation surface side on which an input operation or the like is performed on the sensor device 1B. On the other hand, the detecting electrode 14 and the second shield portion 20 are disposed (formed) on the second surface 15*b* located on the side opposite to the operation surface side with respect to the first surface 15*a*.

The insulating substrate 11 of the present embodiment has regions A, B, and D along the X direction (horizontal direction) in the figure. The length of the region D along the X direction is shorter than the length of the region B along the X direction. The length dD along the X direction of the region D is set on the basis of the length obtained by subtracting the length dA along the X direction of the region A from the length dB along the X direction of the region B. The distance dAD can be set between the end AE of the folded region A and the end DE of the region D. In this case, the length dD of the region D is set so that dD+dAD+dA=dB.

In the sensor device 1B shown in FIG. 2A, the sensor electrode 12 and the first shield portion 13 are formed in the region B. On the other hand, one detecting electrode 14 and one second shield portion 20 are formed in each of the regions A and D. As shown in the expansion plan view of FIG. 2A, the sensor electrode 12, the first shield portion 13, the detecting electrode 14, and the second shield portion 20 are formed on the same main surface 11*a* of the insulating substrate 11.

The sensor device 1B shown in the figure has a predetermined region R between the region A and the region B, that is, at a connecting portion where the region A and the region B are connected. Similarly, the sensor device 1B has a predetermined region R between the region B and the region D, that is, at the connecting portion where the region B and the region D are connected.

Each of the two predetermined regions R includes a bent portion F. The bent portion F of the present embodiment is formed by cutting out a region of the insulating substrate 11 along the Y-axis direction in the figure and includes two bending lines L1 and L2 at different positions along the X axis. The region A folded at the vicinity of the bending line L1 or L2 has a positional relationship substantially parallel to the region B, and the detecting electrode 14 formed in the region A and the shield electrode 131 are arranged to face each other. The region D folded at the vicinity of the bending line L1 or L2 has a positional relationship substantially parallel to the region B, and the detecting electrode 14 formed in the region D and the shield electrode 131 are arranged to face each other. The sensor device 1B is assembles by such folding actions. A cross-section of the assembled sensor device 1D is shown in FIG. 2B.

Also in the present embodiment, the cover panel 17 is disposed on the surface (operation surface/input surface) of the sensor device 1B. LEDs 16*a*, 16*b*, 16*c* as light emitters may be disposed on the main surface 11*a* of the region D of the insulating substrate 11. As shown in FIG. 2B, when the operator FIN touches the cover panel 17, a signal (operation command) is input.

The sensor electrodes 12*a*, 12*b* and 12*c* detect a change in capacitance between the sensor electrodes 12*a*, 12*b* and 12*c* and the operator FIN. The sensor electrodes 12*a*, 12*b* and 12*c* have the same functions as the electrodes of a general capacitance sensor of the self-capacitance type.

The sensor electrodes 12*a*, 12*b* and 12*c* form a touch sensor TS that detects a change in capacitance between the sensor electrodes 12*a*, 12*b* and 12*c* and the operator FIN and outputs a change value (Diff value) in capacitance as a detection result. The detecting electrode 14 and the shield electrode 131 form a pressure-sensitive sensor that detects a change in capacitance between the detecting electrode 14 and the shield electrode 131 and outputs a change value (Diff value) of the capacitance as a detection result.

Similar to the sensor device 1A of the first embodiment described above, since the sensor device 1B of the second embodiment shown in FIG. 2A and FIG. 2B includes not only the touch sensor TS formed by the operator FIN and the sensor electrode 12 but also a pressure-sensitive sensor formed by a shield electrode 131 and a detecting electrode 14, it is possible to provide a sensor device 1B in which erroneous detection is suppressed.

Similar to the first embodiment described above, since the shield electrode 131 functions both as one electrode of the pressure-sensitive sensor and as a blocking body, it is possible to suppress the increase in the number of parts of the sensor device 1B. Therefore, it is possible to reduce the total thickness of the sensor device 1B and to suppress the cost increase of the sensor device 1B.

Further, in the sensor device 1B of the second embodiment shown in FIG. 2A and FIG. 2B, since the second shield portion 20 is disposed on the same second surface 15*b* as the detecting electrode 14 in at least a part of the periphery of the detecting electrode 14, it possible to eliminate noise and accurately detect the capacitance between the detecting electrode 14 and the shield electrode 131.

Third Embodiment

Figure 3B:
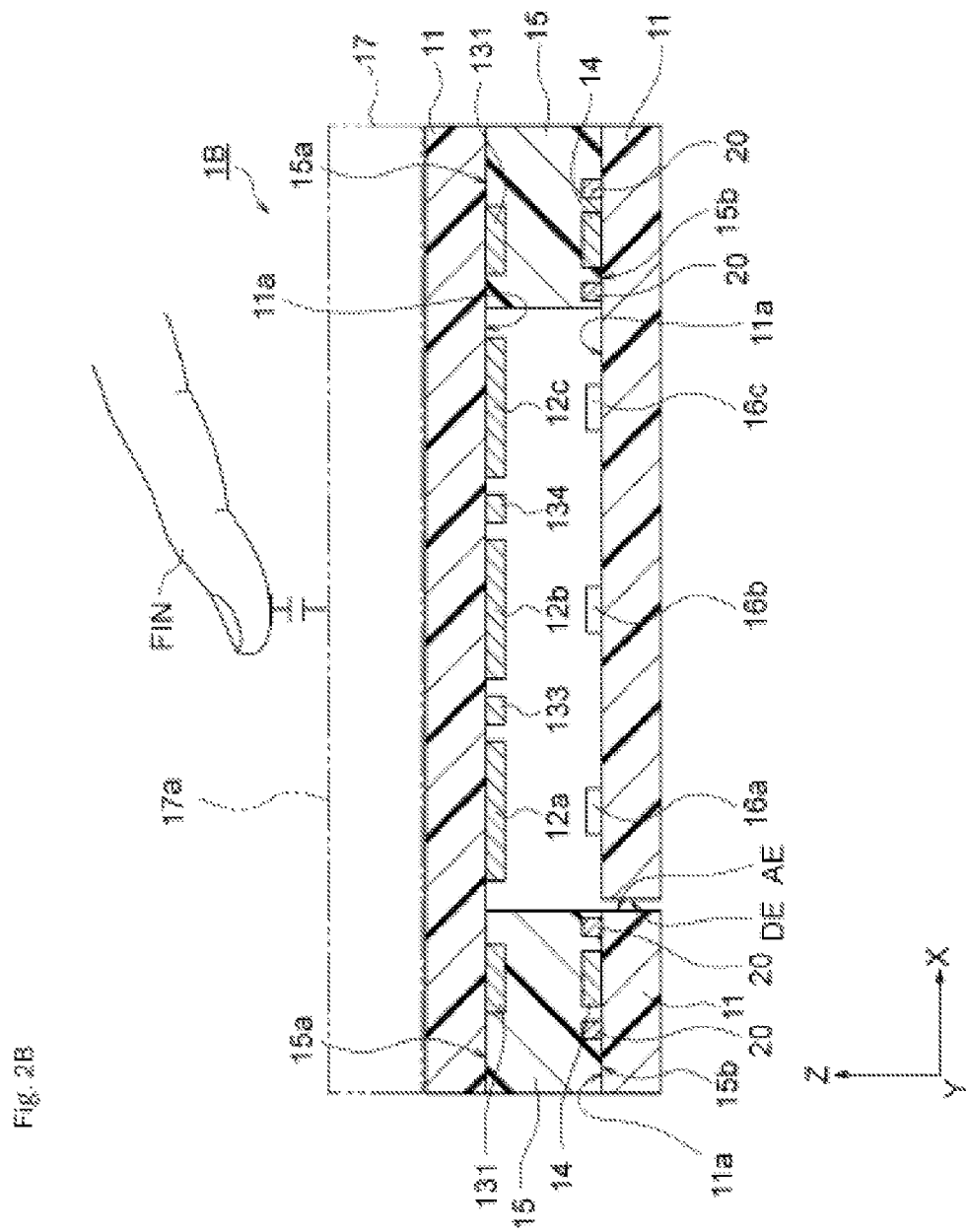
FIG. 3B is a cross-sectional view of the sensor device taken along IIIB-IIIB line of FIG. 3A.
Figure 3A:
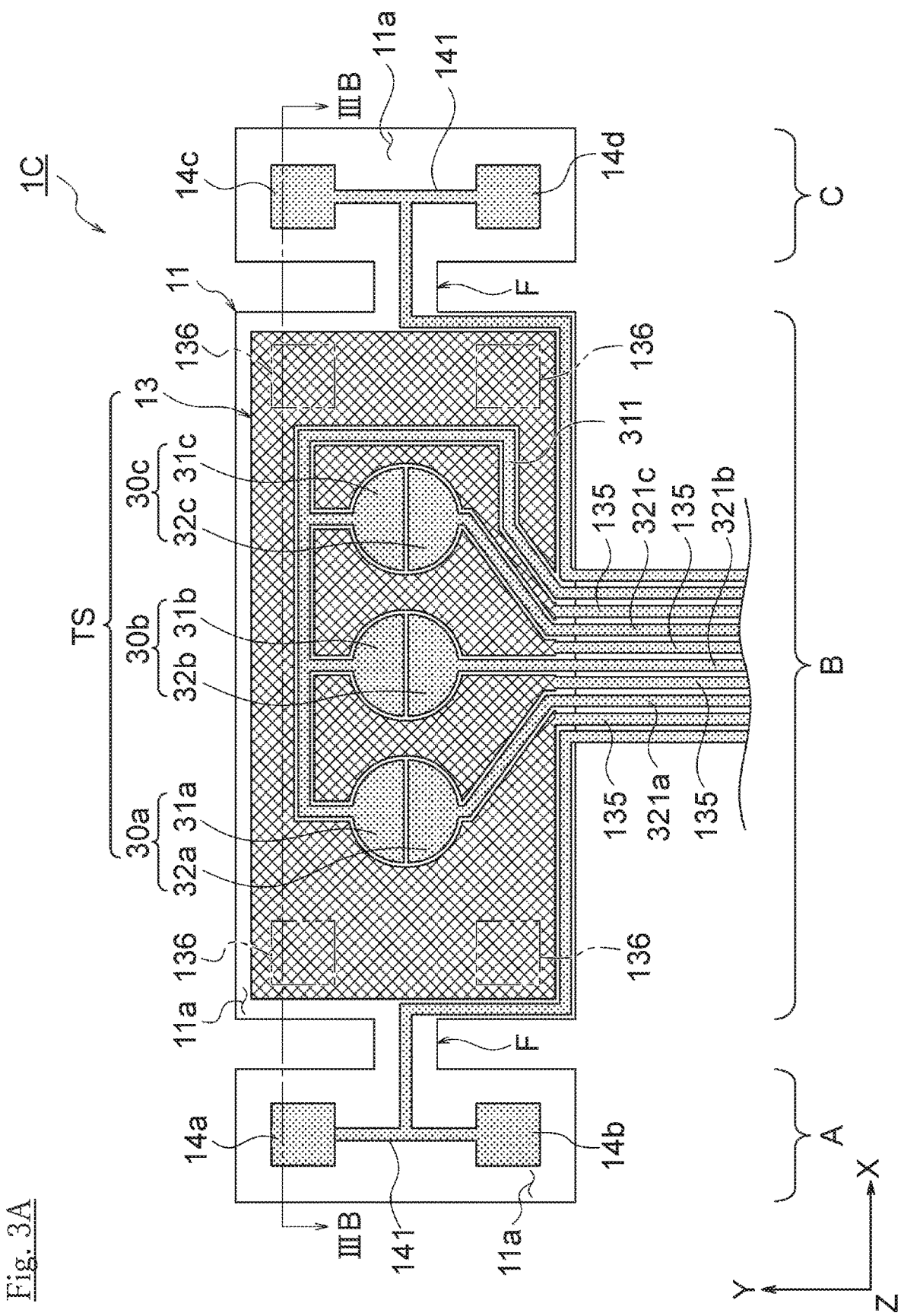
FIG. 3A is an expansion plan view illustrating a sensor device in the third embodiment of the present invention.
Figure 3B:
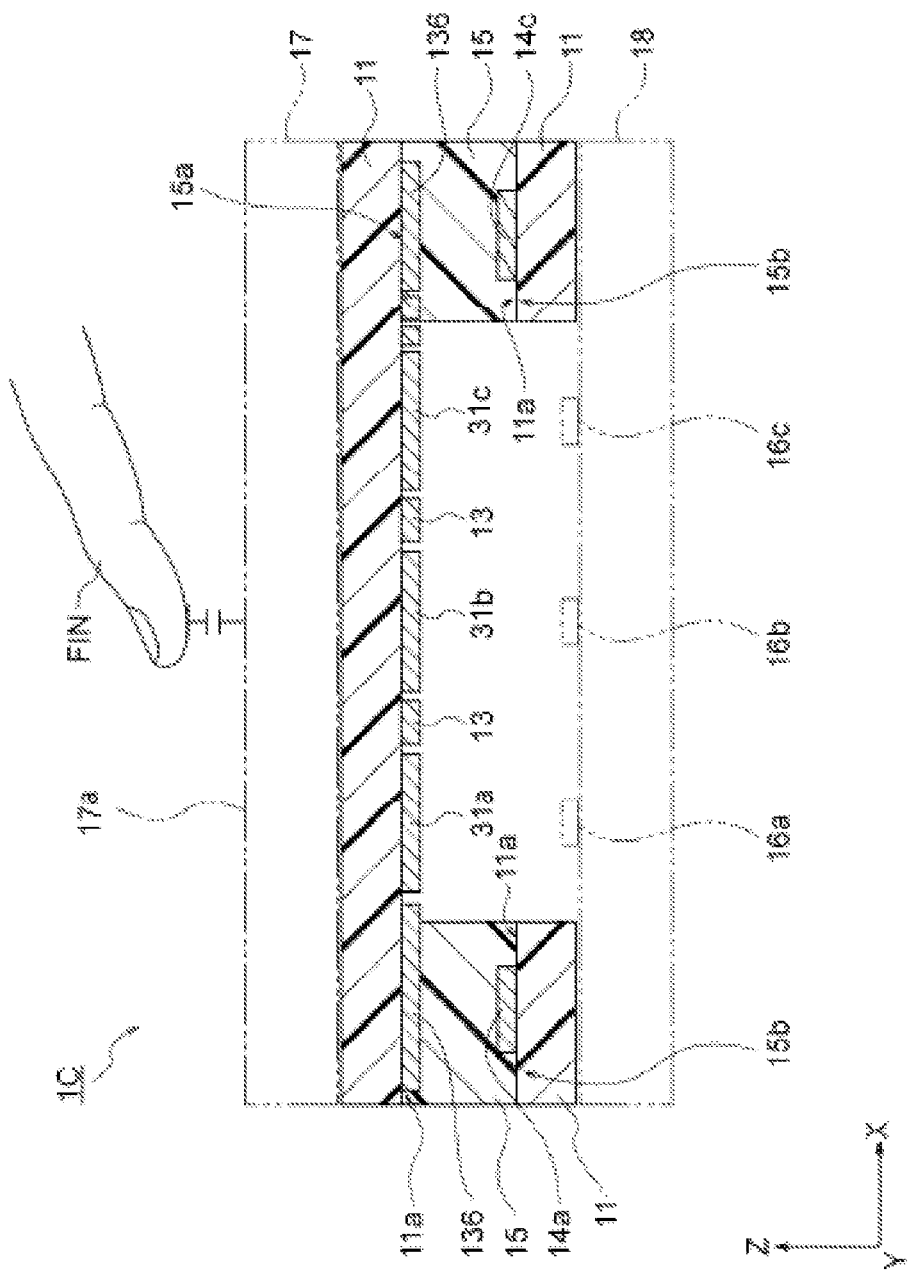

FIG. 3A is an expansion plan view illustrating a sensor device in the third embodiment of the present invention, and FIG. 3B is a cross-sectional view of the sensor device taken along IIIB-IIIB line of FIG. 3A.

The present embodiment is different from the first embodiment in that (a) the touch sensor TS is a mutual capacitance type capacitance sensor, and (b) the first shield portion 13 is disposed on the entire surface of the region B of the insulating substrate 11, and (c) two detecting electrodes 14*a* and 14*b* (detecting electrodes 14*c* and 14*d*) are disposed in each region A (region C) of the insulating substrate 11. Hereinafter, only differences between the sensor device 1C in the third embodiment and the first embodiment will be described, and portions having the same configurations as those in the first embodiment will be denoted by the same reference numerals, and descriptions thereof will be omitted.

As shown in FIG. 3A and FIG. 3B, the sensor device 1C of the present embodiment includes an insulating substrate 11, sensor electrodes 30a to 30c, a first shield portion 13, detecting electrodes 14a to 14d, and spacers 15.

Similar to the first embodiment, the insulating substrate 11 has regions A to C along the X direction in the figure, has a bent portion F between the regions A and B, and also has a bent portion F between the region B and the region C. Then, the two detecting electrodes 14a and 14b are disposed in the region A, the sensor electrodes 30a to 30c and the first shield portion 13 are disposed in the region B, and the two detecting electrodes 14c and 14d are disposed in the region C. As shown in FIG. 3A, the sensor electrodes 30a to 30c, the first shield portion 13, and the detecting electrodes 14a to 14d are formed on the same main surface 11a of the insulating substrate 11.

The three sensor electrodes 30a to 30c are arranged along the X direction in the figure. Each of the sensor electrodes 30a to 30c is composed of two electrodes. Specifically, the sensor electrode 30a is composed of an input electrode (transmission electrode) (Tx) 31a and a receiving electrode (Rx) 32a. Similarly, the sensor electrode 30b is also composed of the input electrode 31b and the receiving electrode 32b, and the sensor electrode 30c is also composed of the input electrode 31c and the receiving electrode 32c.

The input electrode 31a and the receiving electrode 32a are arranged to be adjacent to each other at intervals along the Y direction in the figure. In the present embodiment, each of the input electrode 31a and the receiving electrode 32a has a semicircular shape, and the input electrode 31a and the receiving electrode 32a are arranged so that the entire contour of the sensor electrode 30a is substantially circular. The shapes of the input electrode 31a and the receiving electrode 32a are not particularly limited to the above as long as the input electrode 31a and the receiving electrode 32a are arranged to be adjacent to each other with a gap. For example, the input electrode 31a and the receiving electrode 32a may have a rectangular shape or a comb-tooth shape.

Similarly for the sensor electrode 30b, each of the input electrode 31b and the receiving electrode 32b has a semicircular shape, and the input electrode 31b and the receiving electrode 32b are disposed so that the entire outline of the sensor electrode 30b is substantially circular. Similarly for the sensor electrode 30c, each of the input electrode 31c and the receiving electrode 32c has a semicircular shape, and the input electrode 31c and the receiving electrode 32c are disposed so that the entire outline of the sensor electrode 30c is substantially circular.

One lead wiring 311 is branched and connected to the three input electrodes 31a to 31c. The input electrodes 31a to 31c are connected to an external circuit device (not shown) via the lead wiring 311. On the other hand, three lead wirings 321a to 321c are respectively connected to the three receiving electrodes 32a to 32c. The receiving electrodes 32a to 32c are individually connected to the external circuit device via the lead wirings 321a to 321c.

In the present embodiment, an electric field is generated between the input electrode 31a and the receiving electrode 32a by applying a voltage to the input electrode 31a from the external circuit device. Since the above-described electric field changes and the capacitance between the electrodes 31a and 32a also changes when the operator FIN approaches, the receiving electrode 32a detects the capacitance change, thereby detecting the contact of the operator FIN. Since the voltage is applied to the input electrode 31a from the external circuit device as described above, the potential of the input electrode 31a is not changed by the approach of the operator FIN.

Similarly for the sensor electrode 30b, a voltage is applied to the input electrode 31b from the external circuit device to generate an electric field between the input electrode 31b and the receiving electrode 32b, and the receiving electrode 32b detects the capacitance change between the electrodes 31b and 32b, thereby detecting the contact of the operator FIN. Similarly for the sensor electrode 30c, a voltage is applied to the input electrode 31c from the external circuit device to generate an electric field between the input electrode 31c and the receiving electrode 32c, and the receiving electrode 32c detects the capacitance change between the electrodes 31c and 32c, thereby detecting the contact of the operator FIN.

The first shield portion 13 of the present embodiment is disposed in substantially the entire region B of the insulating substrate 11 except for the periphery of the sensor electrodes 30a to 30c and the periphery of the lead wirings 311, 321a to 321c. The first shield portion 13 has a mesh shape as shown in FIG. 3A, however is not particularly limited to this shape, and the first shield portion 13 may have a solid pattern. Further, as in the first embodiment described above, the shape of the first shield portion 30 may be a frame shape that surrounds the sensor electrodes 30a to 30c.

In the present embodiment, the first shield portion 13 is divided into four regions due to the layout of the sensor electrodes 30a to 30c and the lead wirings 311, 321a to 321c. The lead wiring 135 is individually connected to each region, and the first shield portion 13 is connected to the ground or a constant potential via the lead wiring 135.

The detecting electrodes 14a and 14b are arranged at both ends of the region A of the insulating substrate 11 in the Y direction in the figure. A single lead wiring 141 is branched and connected to the two detecting electrodes 14a and 14b. The detecting electrodes 14a and 14b are connected to the external circuit device via the lead wiring 141.

Similarly, the detecting electrodes 14c and 14d are also arranged at both ends of the region C of the insulating substrate 11 in the Y direction in the figure. A single lead wiring 141 is branched and connected to the two detecting electrodes 14c and 14d. The detecting electrodes 14c and 14d are connected to the external circuit device via the lead wiring 141.

The sensor electrodes 30a to 30c, the first shield portion 13, and the detecting electrodes 14a to 14d described above are formed by the same material and manufacturing method as the sensor electrode 12, the first shield portion 13, and the detecting electrode 14 described in the first embodiment.

Similar to the first embodiment, by folding one of the bent portions F, the region A and the region B overlap each other through the spacer 15, and the detecting electrodes 14a and 14b face parts 136 (the facing portions 136) of the first shield portion 13. Similarly, by folding the other bent portion F, the region C and the region B overlap each other through the spacer 15, and the detecting electrodes 14c and 14d face parts 136 (the facing portions 136) of the first shield portion 13. The sensor device 1C is assembles by such folding actions. A cross-section of the assembled sensor device 1C is shown in FIG. 3B. In this state, the sensor electrodes 30a to 30c and the first shield portion 13 are disposed on the first surface 15a, whereas the detecting electrodes 14a to 14d are disposed on the second surface 15b.

In the present embodiment, the sensor electrodes 30a to 30c and the first shield portion 13 form the touch sensor TS. Specifically, as described above, the sensor electrodes 30a to 30c detect the contact of the operator FIN by detecting the change in capacitance. At this time, the first shield portion 13 eliminates noise so that it is possible to accurately detected the capacitance between the sensor electrodes 30a to 30c and the operator FIN.

Further, in the present embodiment, the detecting electrodes 14a to 14d and the facing portions 136 of the first shield portion 13 form a pressure-sensitive sensor. Specifically, since the intervals between the detecting electrode 14a to 14d and the facing portions 136 are narrowed with the pressing of the operator FIN, the detecting electrodes 14a to 14d detect a change in the capacitance according to the change in the interval.

That is, in the present embodiment, the facing portion 136 forming the pressure-sensitive sensor is also a part of the first shield portion 13 forming the touch sensor TS, and the facing portion 136 that is a part of the first shield portion 13 in the touch sensor TS serves as a function of the electrodes forming a pair with the detecting electrode 14a to 14d of the pressure-sensitive sensor.

Further, in the present embodiment, since the first surface 15a provided with the first shield portion 13 is located closer to the operating surface of the sensor device 1C than the second surface 15b provided with the detecting electrodes 14a to 14d, it is possible to block the capacitive coupling between the operator FIN and the detecting electrodes 14a to 14d. Therefore, the first shield portion 13 functions as a blocking body that prevents erroneous detection of the pressure-sensitive sensor due to the approach of the operator FIN.

As described above, in the present embodiment, since the first shield portion 13 functions both as one electrode of the pressure-sensitive sensor and as a blocking body, it is possible to suppress the increase in the number of parts. Therefore, it is possible to reduce the total thickness of the sensor device 1C and to suppress the cost increase of the sensor device 1C.

Fourth Embodiment

FIG. 4 is an expansion plan view illustrating the sensor device in the fourth embodiment of the present invention.

The present embodiment is different from the third embodiment in that the blocking electrodes are provided. Hereinafter, only differences between the sensor device 1D in the fourth embodiment and the third embodiment will be described, and portions having the same configurations as those in the third embodiment will be denoted by the same reference numerals, and descriptions thereof will be omitted.

As shown in FIG. 4A, the sensor device 1D includes four blocking electrodes 40a to 40d in addition to the insulating substrate 11, the sensor electrodes 30a to 30c, the first shield portion 13, and the detecting electrodes 14a to 14d and the spacers 15.

The blocking electrodes 40a to 40d are disposed in the region B of the insulating substrate 11. The blocking electrodes 40a to 40d are disposed on the main surface 11a of the insulating substrate 11 so as to respectively face the detecting electrodes 14a to 14d in a state in which the insulating substrate 11 is folded at the bending portion F. In the present embodiment, the blocking electrodes 40a to 40d are larger than the detecting electrodes 14a to 14d, and the blocking electrodes 40a to 40d cover the detecting electrodes 14a to 14d in a state in which the insulating substrate 11 is folded at the bending portion F. The four blocking electrodes 40a to 40d are connected by lead wirings 311 connecting the input electrodes 31a to 31c of the sensor electrodes 30a to 30c and have the same potential as the input electrodes 31a to 31c.

The blocking electrodes 40a to 40d are formed by the same material and manufacturing method as the sensor electrode 12, the first shield portion 13, and the detecting electrode 14 described in the first embodiment. The first shield portion 13 of the present embodiment is not formed around the blocking electrodes 40a to 40d in addition to the sensor electrodes 30a to 30c and the lead wirings 311 and 321a to 321c.

In the present embodiment, the sensor electrodes 30a to 30c and the first shield portion 13 form the touch sensor TS. Further, in the present embodiment, the detecting electrodes 14a to 14d and the blocking electrodes 40a to 40d form a pressure-sensitive sensor.

Although not particularly shown, similar to FIG. 3B of the third embodiment, the first surface 15a provided with the blocking electrodes 40a to 40d is located closer to the operating surface of the sensor device 1D than the second surface 15b provided with the detecting electrodes 14a to 14d, and the blocking electrodes 40a to 40d are connected to the input electrodes 31a to 31c and have the same potential as the input electrodes 31a to 31c. Therefore, since it is possible to block the capacitive coupling between the operator FIN and the detecting electrodes 14a to 14d, the blocking electrodes 40a to 40d function as a blocking body for preventing erroneous detection of the pressure-sensitive sensor due to the approach of the operator FIN.

As described above, in the present embodiment, since the blocking electrodes 40a to 40d functions both as one electrode of the pressure-sensitive sensor and as a blocking body, it is possible to suppress the increase in the number of parts. Therefore, it is possible to reduce the total thickness of the sensor device 1D and to suppress the cost increase of the sensor device 1D.

Fifth Embodiment

Figure 5:
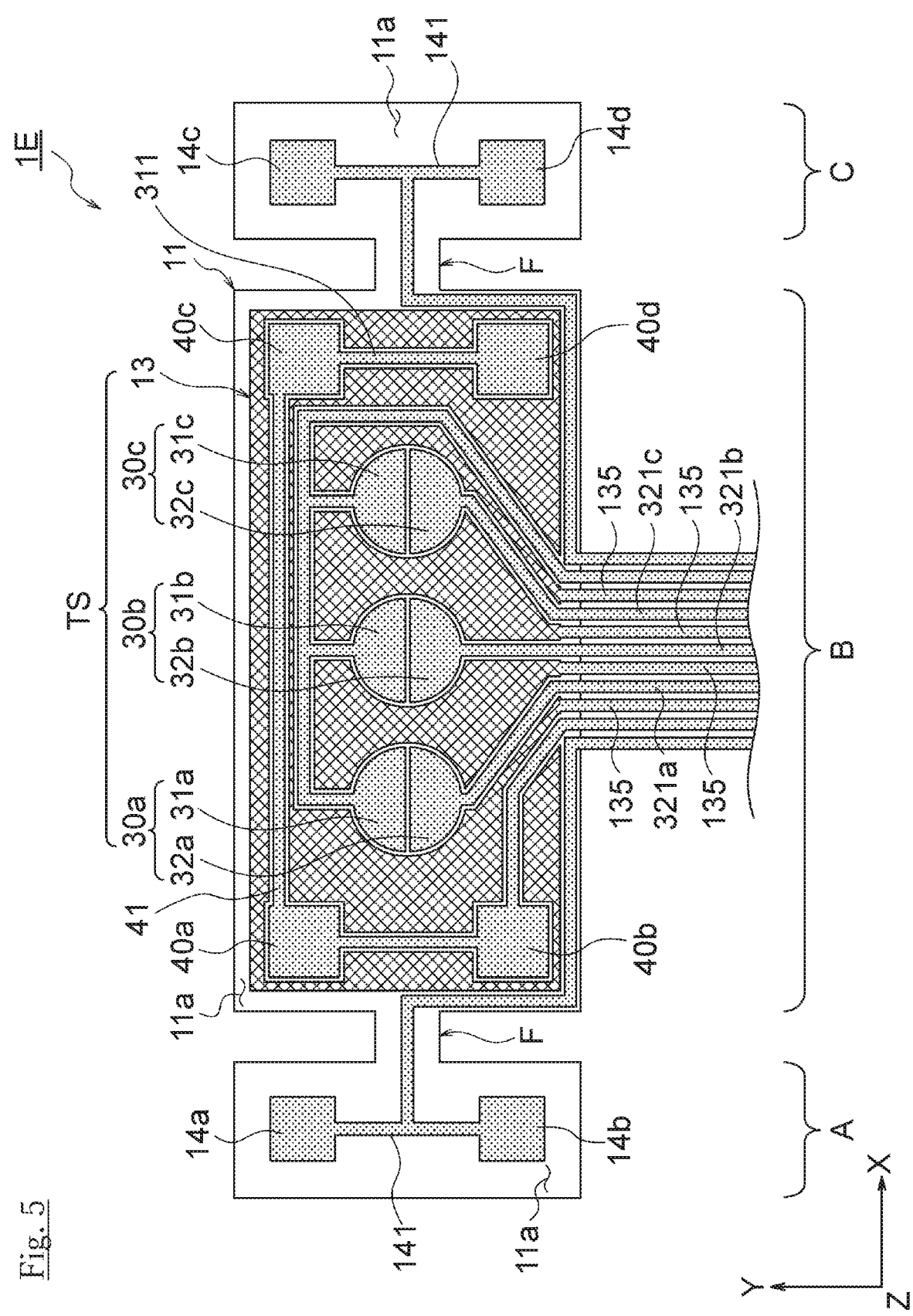
FIG. 5 is an expansion plan view illustrating the sensor device in the fifth embodiment of the present invention.

FIG. 5 is an expansion plan view illustrating the sensor device in the fifth embodiment of the present invention.

The present embodiment is different from the fourth embodiment in that the blocking electrodes are not directly connected to the input electrodes though the lead wiring. Hereinafter, only differences between the sensor device 1E in the fifth embodiment and the fourth embodiment will be described, and portions having the same configurations as those in the fourth embodiment will be denoted by the same reference numerals, and descriptions thereof will be omitted.

In the present embodiment, the blocking electrodes 40a to 40d are not connected to the lead wiring 311 connecting to the input electrodes 31a to 31c. A lead wiring 41 independent of the lead wiring 311 is connected to the blocking electrodes 40a to 40d, and the blocking electrodes 40a to 40d are connected to an external circuit device via the lead wiring 41. At this time, a voltage is applied to the four blocking electrodes 40a to 40d by the external circuit device, and the blocking electrodes 40a to 40d have substantially the same potential as the potentials of the input electrodes 31a to 31c of the sensor electrodes 30a to 30c. (That is, the locking electrodes 40a to 40d have the same potential as the input electrodes 31a to 31c).

Similar to FIG. 4B of the fourth embodiment, the first surface 15a provided with the blocking electrodes 40a to 40d is located closer to the operating surface of the sensor device 1E than the second surface 15b provided with the detecting electrodes 14a to 14d, and the blocking electrodes 40a to 40d have the same potential as the input electrodes 31a to 31c. Therefore, since it is possible to block the capacitive coupling between the operator FIN and the detecting electrodes 14a to 14d, the blocking electrodes 40a to 40d function as a blocking body for preventing erroneous detection of the pressure-sensitive sensor due to the approach of the operator FIN.

As described above, in the present embodiment, since the blocking electrodes 40a to 40d functions both as one electrode of the pressure-sensitive sensor and as a blocking body, it is possible to suppress the increase in the number of parts. Therefore, it is possible to reduce the total thickness of the sensor device 1E and to suppress the cost increase of the sensor device 1E.

Sixth Embodiment

Figure 6A:
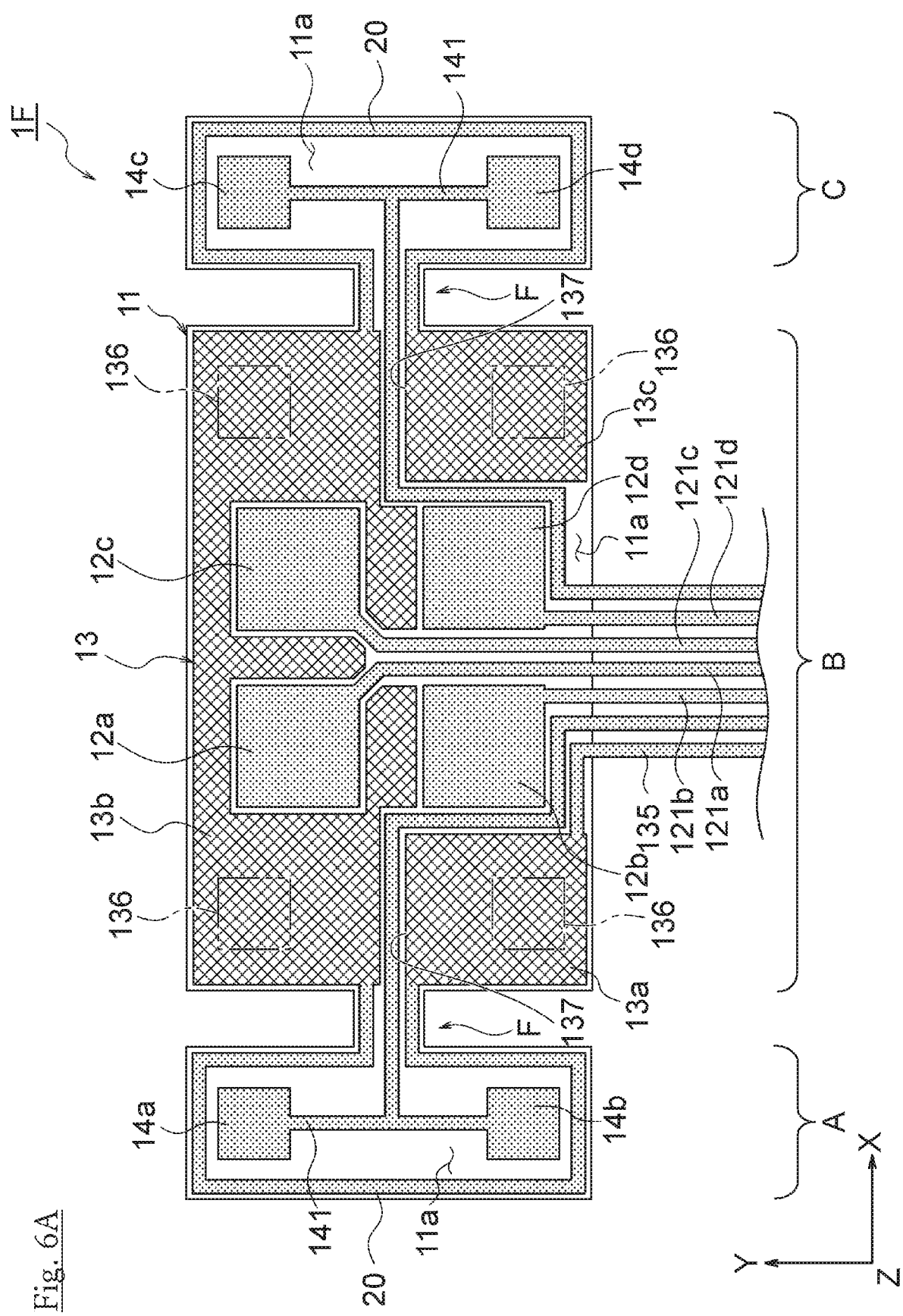
FIG. 6A is an expansion plan view illustrating the sensor device in the sixth embodiment of the present invention.
Figure 6C:
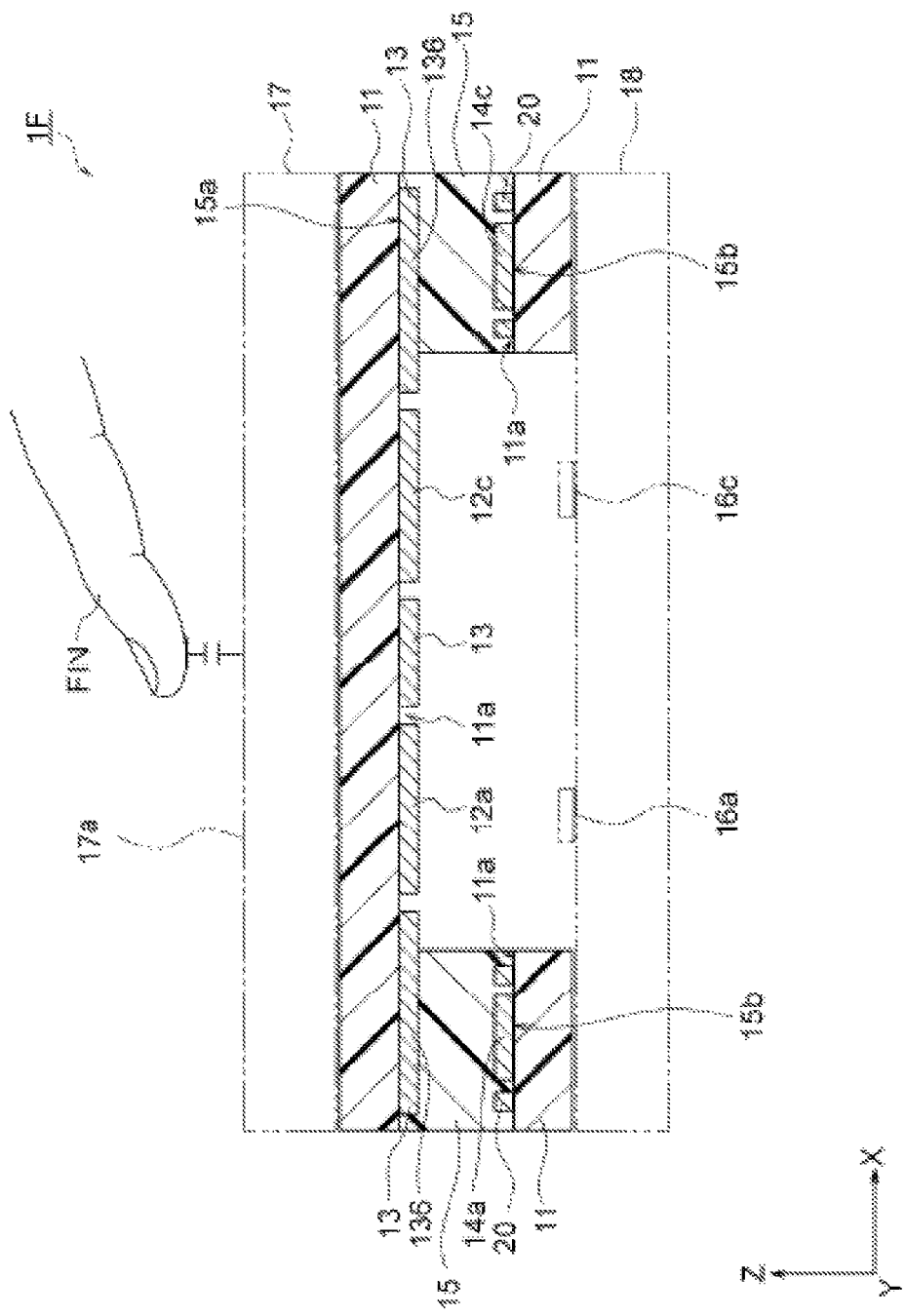
FIG. 6C is a cross-sectional view of the sensor device taken along VIC-VIC line of FIG. 6B.

FIG. 6A is an expansion plan view illustrating the sensor device in the sixth embodiment of the present invention, FIG. 6B is a plan view illustrating a state in which the regions A and C of the sensor device shown in FIG. 6A are bent, and FIG. 6C is a cross-sectional view of the sensor device taken along VIC-VIC line of FIG. 6B.

The present embodiment is different from the first embodiment in that (a) four sensor electrodes 12a to 12d are arranged in matrix, (b) the first shield portion 13 is disposed on the entire surface of the region B of the insulating substrate 11, (c) two detecting electrodes 14a and 14b (detecting electrodes 14c and 14d) are disposed in each region A (region C) of the insulating substrate 11, and (d) the second shield portion 13 is disposed on each region A (region C) of the insulating substrate 11. Hereinafter, only differences between the sensor device 1F in the sixth embodiment and the first embodiment will be described, and portions having the same configurations as those in the first embodiment will be denoted by the same reference numerals, and descriptions thereof will be omitted.

The sensor electrodes 12a to 12d of the present embodiment are capacitance sensors of the self-capacitance type, similar to the sensor electrodes 12a to 12c of the first embodiment. As shown in FIG. 6A, the four sensor electrodes 12a to 12d are disposed on the main surface 11a of the insulating substrate 11 and are arranged in two rows and two columns. Four lead wirings 121a to 121d are respectively connected to the sensor electrodes 12a to 12d, and the sensor electrodes 12a to 12d are individually connected to an external circuit device via the lead wirings 121a to 121d.

The detecting electrodes 14a and 14b are arranged at both ends of the region A of the insulating substrate 11 in the Y direction in the figure. A single lead wiring 141 is branched and connected to the two detecting electrodes 14a and 14b. The detecting electrodes 14a and 14b are connected to the external circuit device via the lead wiring 141.

Similarly, the detecting electrodes 14c and 14d are also arranged at both ends of the region C of the insulating substrate 11 in the Y direction in the figure. A single lead wiring 141 is branched and connected to the two detecting electrodes 14c and 14d. The detecting electrodes 14c and 14d are connected to the external circuit device via the lead wiring 141.

The first shield portion 13 of the present embodiment is disposed over almost the entire area of the region B of the insulating substrate 11 except for the periphery of the sensor electrodes 12a to 12d and the periphery of the lead wirings 121a to 121d and 141. The first shield portion 13 has a mesh shape as shown in the FIG. 6A, however the first shield portion 13 is not particularly limited to this shape and may have a solid pattern. Further, as in the first embodiment described above, the shape of the first shield portion 30 may be a frame shape to surround the sensor electrodes 12a to 12d.

In the present embodiment, the first shield portion 13 has two slits 137. The slits 137 extend linearly and divides the first shield portion 13 into three regions 13a to 13c. The lead wiring 141 connected to the detecting electrode 14a and 14b passes through the first shield portion 13 via one of the slits 137, and the lead wiring 141 is sandwiched between the two regions 13a and 13b of the first shield 13. Similarly, the lead wiring 141 connected the detecting electrode 14c and 14d passes through the first shield portion 13 via the other slit 137, and the lead wiring 141 is sandwiched between the two regions 13b and 13c of the first shield portion 13.

The second shield portions 20 are respectively disposed on the main surfaces 11a of the regions A and C of the insulating substrate 11 and surround the periphery of the detecting electrodes 14a to 14d. The second shield portion 20 is connected to the first shield portion 13 and is connected to the ground or a constant potential via the first shield portion 13.

The sensor electrodes 12a to 12d, the first shield portion 13, and the detecting electrodes 14a to 14d described above are formed by the same material and manufacturing method as the sensor electrode 12, the first shield portion 13, and the detecting electrode 14 described in the first embodiment.

As shown in FIG. 6B, by folding one of the bent portions F, the region A and the region B overlap each other through the spacer 15, and the detecting electrodes 14a and 14b face parts 136 (the facing portions 136) of the first shield portion 13. Similarly, by folding the other bent portion F, the region C and the region B overlap each other through the spacer 15, and the detecting electrodes 14c and 14d face parts 136 (the facing portions 136) of the first shield portion 13. The sensor device 1F is assembles by such folding actions. A cross-section of the assembled sensor device 1F is shown in FIG. 6C. In this state, the sensor electrodes 12a to 12d and the first shield portion 13 are disposed on the first surface 15a, whereas the detecting electrodes 14a to 14d and the second shield portions 20 are disposed on the second surface 15b.

In a state of folding the insulating substrate 11 at the bent portion F, since the detecting electrode 14a and 14b respectively face the region 13b and 13a of the first shield portion 13, one of the lead wirings 141 passing between the region 13b and 13a does not overlap the detecting electrodes 14a and 14b. Similarly, in a state of folding the insulating substrate 11 at the bent portion F, since the detecting electrodes 14c and 14d respectively face the regions 13b and 13c of the first shield portion 13, the other lead wiring 141 passing between the regions 13b and 13c does not overlap the detecting electrode 14c and 14d.

The shape of the spacer 15 is not limited to the rectangular plate shape corresponding to the region A or the region C of the insulating substrate 11.

Figure 7A:
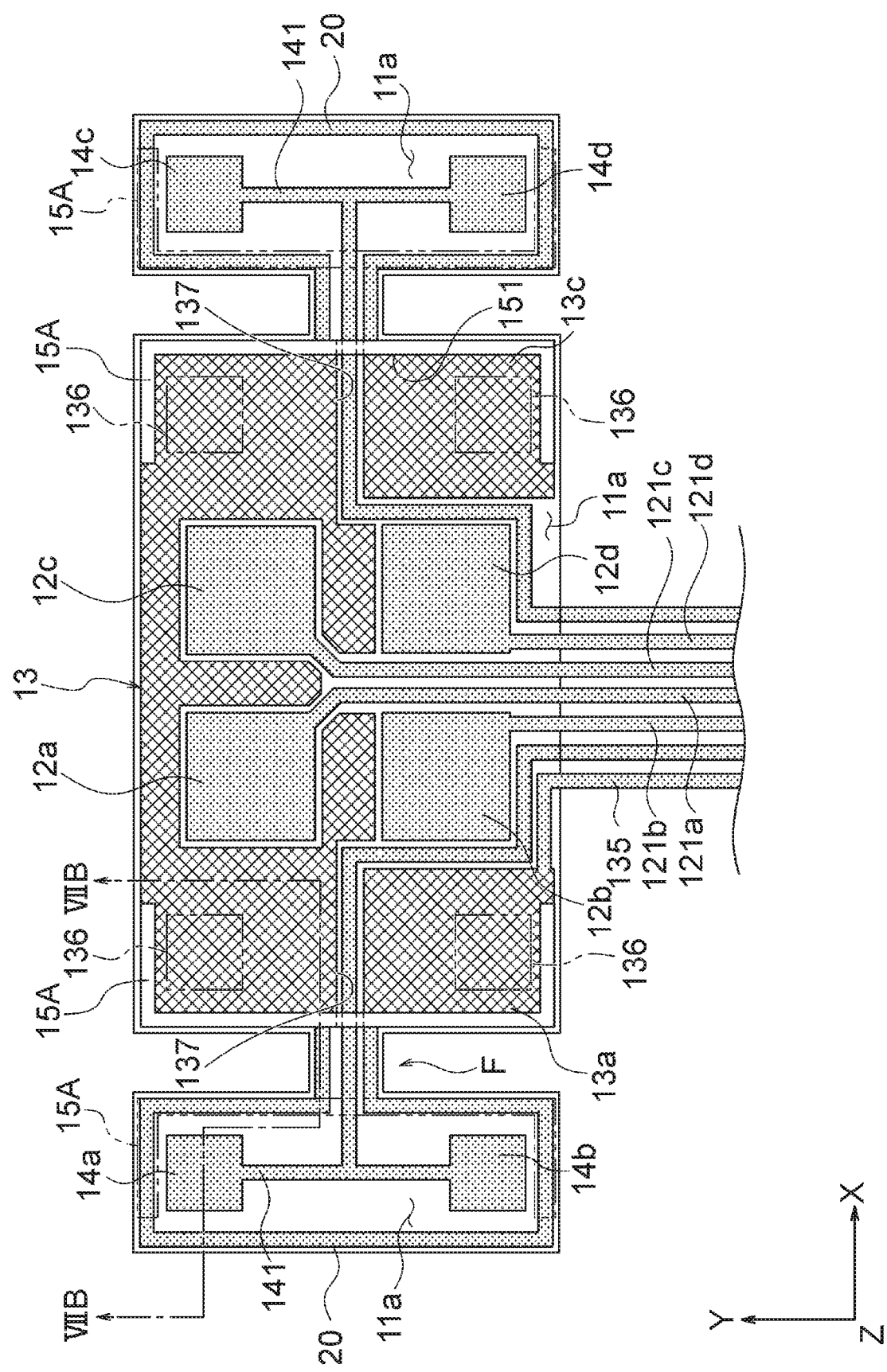
FIG. 7A is an expansion plan view illustrating the first modification of the sensor device in the sixth embodiment.
Figure 7B:
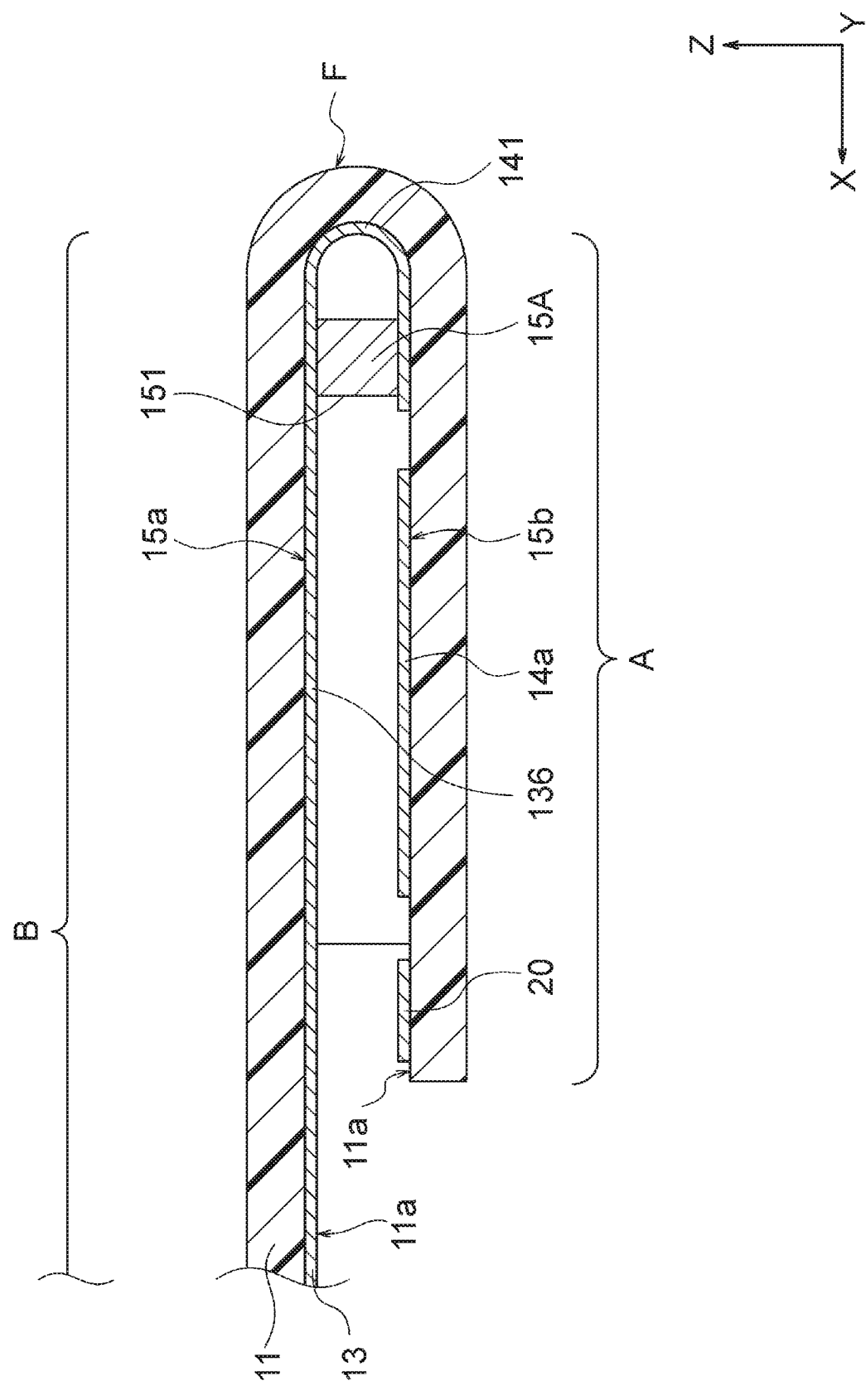
FIG. 7B is a cross-sectional view of the sensor device taken along VIIB-VIIB line of FIG. 7A.

FIG. 7A is an expansion plan view illustrating the first modification of the sensor device in the sixth embodiment, and FIG. 7B is a cross-sectional view of the sensor device taken along VIIB-VIIB line of FIG. 7A.

For example, as shown in FIG. 7A and FIG. 7B, the shape of the spacer 15A may be a substantially U-shape having an opening 151. In this case, one spacer 15A is sandwiched between the region A and the region B of the insulating substrate 11 so that the opening 151 is interposed between the detecting electrodes 14a and 14b and the first shield portion 13. Similarly, the other spacer 15A is sandwiched between the region C and the region B of the insulating substrate 11 so that the opening 151 is interposed between the detecting electrodes 14c and 14d and the first shield portion 13.

Figure 8A:
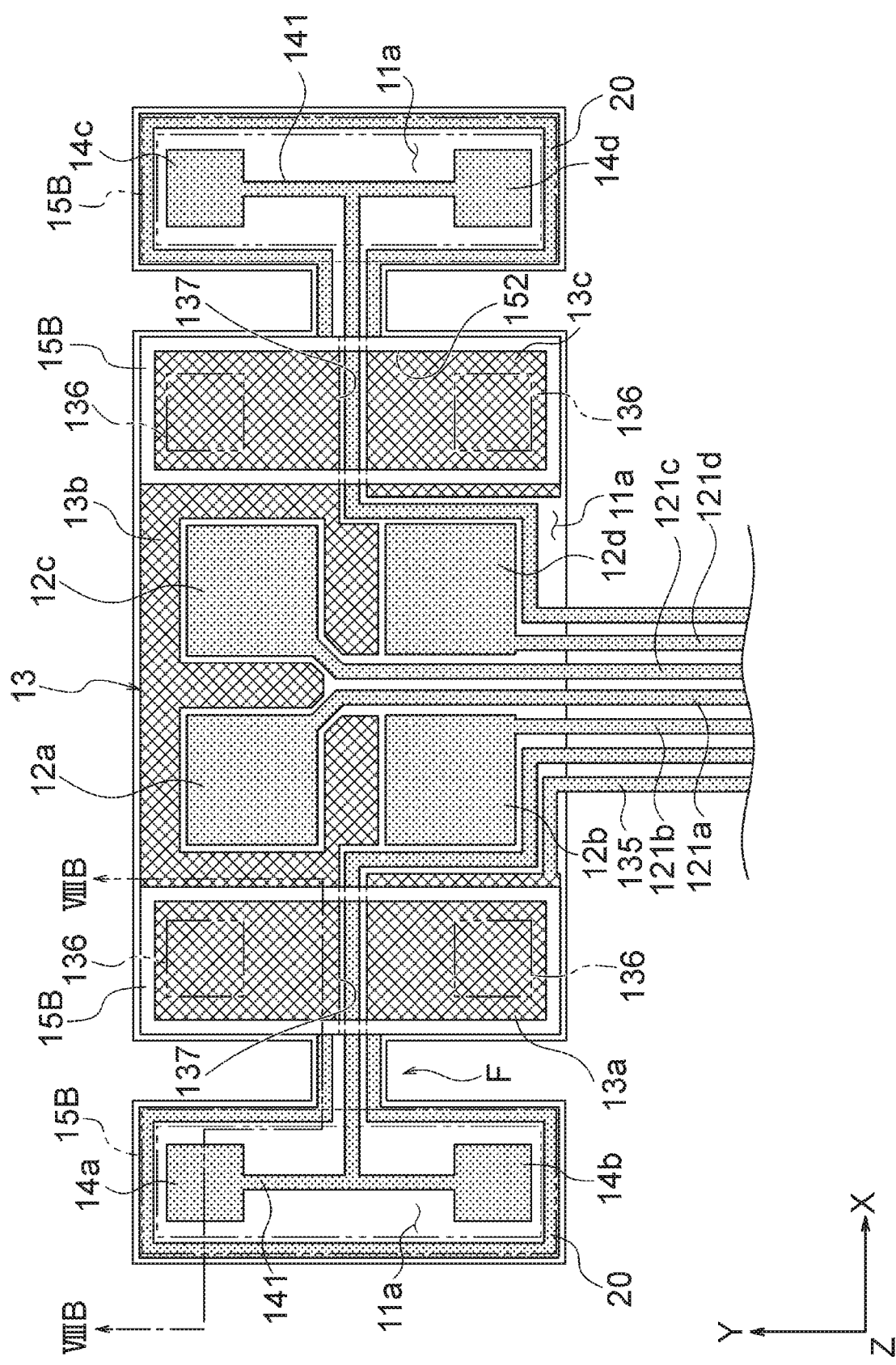
FIG. 8A is an expansion plan view illustrating the second modification of the sensor device in the sixth embodiment.
Figure 8B:
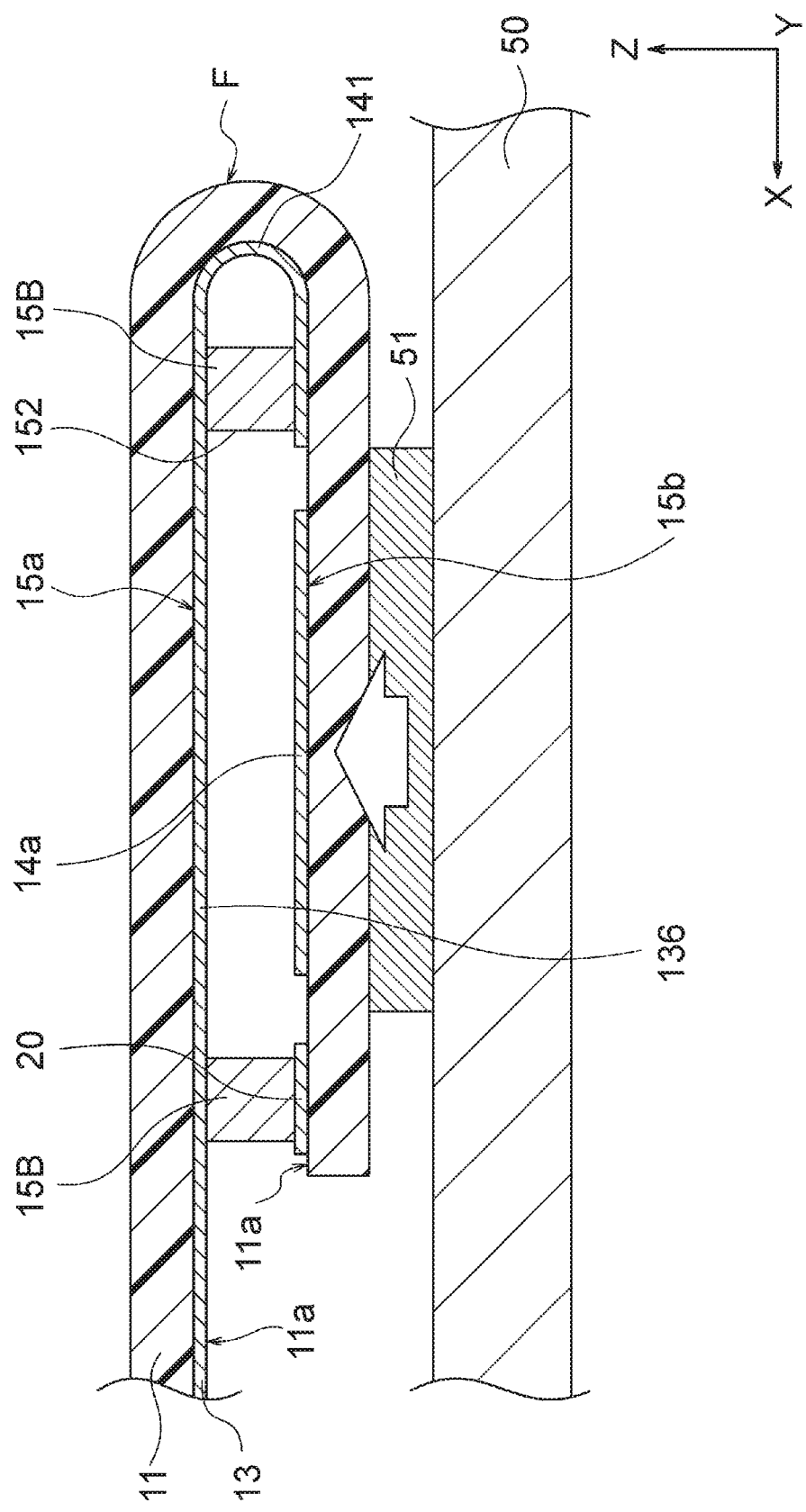
FIG. 8B is a cross-sectional view of the sensor device taken along VIIIB-VIIIB line of FIG. 8A.

FIG. 8A is an expansion plan view illustrating the second modification of the sensor device in the sixth embodiment, and FIG. 8B is a cross-sectional view of the sensor device taken along VIIIB-VIIIB line of FIG. 8A.

Alternatively, as shown in FIG. 8A and FIG. 8B, the shape of the spacer 15B may be a rectangular frame shape having an opening 152. Also in this case, one spacer 15B is sandwiched between the region A and the region B of the insulating substrate 11 so that the opening 152 is interposed between the detecting electrodes 14a and 14b and the first shield portion 13. Similarly, the other spacer 15B is sandwiched between the region C and the region B of the insulating substrate 11 so that the opening 152 is interposed between the detecting electrodes 14c and 14d and the first shield portion 13.

The spacers 15A and 15B do not have to be elastic bodies and may be made of an insulating material (for example, a resin material) having a relatively high Young's modulus.

As shown in the FIG. 8B, the cushion member 51 may be disposed below the sensor device 1F so that the cushion member 51 overlaps the opening 152 of the spacer 15B, and the sensor device 1F may be supported by the support member 50 (e.g., a case of products) via the cushion member 51. In this case, when the sensor device 1F is pressed by the operator FIN, since the regions A and C of the insulating substrate 11 are deflected by the cushioning member 51, the detecting electrodes 14a to 14d and the first shield portion 13 approach each other as indicated by arrows in the figure.

Returning to FIG. 6A to FIG. 6C, in the present embodiment, the sensor electrodes 12a to 12d and the first shield portion 13 form the touch sensor TS. Specifically, the sensor electrodes 12a to 12d detect the contact of the operator FIN by detecting the change in capacitance. At this time, the first shield portion 13 eliminates noise so that it is possible to accurately detected the capacitance between the sensor electrodes 12a to 12c and the operator FIN.

Further, in the present embodiment, the detecting electrodes 14a to 14d and the facing portions 136 of the first shield portion 13 form a pressure-sensitive sensor. Specifically, since the intervals between the detecting electrode 14a to 14d and the facing portions 136 are narrowed with the pressing of the operator FIN, the detecting electrodes 14a to 14d detect a change in the capacitance according to the change in the interval. At this time, the second shield portion 20 eliminates noise so that it is possible to accurately detected the capacitance between the detecting electrodes 14a to 14d and the first shield portion 13.

In the present embodiment, as shown in FIG. 6B, the four detecting electrodes 14a to 14d are disposed around the four sensor electrodes 12a to 12d in a plan view. More specifically, the four sensor electrodes 12a to 12d are disposed inside a virtual frame VF that encompasses all of the detecting electrodes 14a to 14d and is in contact with all of the detecting electrodes 14a to 14d. Thus, even when any of the sensor electrodes 12a to 12d is pressed, it is possible to reliably detect the pressure by the pressure-sensitive sensor.

Further, in the present embodiment, since the lead wirings 141 of the detecting electrodes 14a to 14d are also sandwiched between the first shield portions 13, it is possible to further improve the detection accuracy of the pressure-sensitive sensor.

In the present embodiment, the facing portion 136 forming the pressure-sensitive sensor is also a part of the first shield portion 13 forming the touch sensor TS, and the facing portion 136 that is a part of the first shield portion 13 in the touch sensor TS serves as a function of the electrodes forming a pair with the detecting electrode 14a to 14d of the pressure-sensitive sensor.

Further, in the present embodiment, since the first surface 15a provided with the first shield portion 13 is located closer to the operating surface of the sensor device 1F than the second surface 15b provided with the detecting electrodes 14a to 14d, it is possible to block the capacitive coupling between the operator FIN and the detecting electrodes 14a to 14d. Therefore, the first shield portion 13 functions as a blocking body that prevents erroneous detection of the pressure-sensitive sensor due to the approach of the operator FIN.

As described above, in the present embodiment, since the first shield portion 13 functions both as one electrode of the pressure-sensitive sensor and as a blocking body, it is possible to suppress the increase in the number of parts. Therefore, it is possible to reduce the total thickness of the sensor device 1F and to suppress the cost increase of the sensor device 1F.

Seventh Embodiment

FIG. 9 is an expansion plan view illustrating the sensor device in the seventh embodiment of the present invention.

The present embodiment is different from the first embodiment in that a plurality of detecting electrodes are arranged to correspond to a plurality of sensor electrodes. Hereinafter, only differences between the sensor device 1G in the seventh embodiment and the first embodiment will be described, and portions having the same configurations as those in the first embodiment will be denoted by the same reference numerals, and descriptions thereof will be omitted.

As shown in FIG. 9, the sensor device 1G of the present embodiment includes an insulating substrate 11, sensor electrodes 12a to 12d, a first shield portion 13, detecting electrodes 14a to 14d, and spacers 15.

Similar to the first embodiment, the insulating substrate 11 has regions A to C along the X direction in the figure, has a bent portion F between the regions A and B, and also has a bent portion F between the region B and the region C. Then, the two detecting electrodes 14a and 14b are disposed in the region A, the sensor electrodes 12a to 12d and the first shield portion 13 are disposed in the region B, and the two detecting electrodes 14c and 14d are disposed in the region C. As shown in FIG. 9, the sensor electrodes 12a to 12d, the first shield portion 13, and the detecting electrodes 14a to 14d are formed on the same main surface 11a of the insulating substrate 11.

The sensor electrodes 12a to 12d of the present embodiment are capacitance sensors of the self-capacitance type, similar to the sensor electrodes 12a to 12c of the first embodiment. As shown in FIG. 9, the four sensor electrodes 12a to 12d are disposed on the main surface 11a of the insulating substrate 11 and are arranged in two rows and two columns. Four lead wirings 121a to 121d are respectively connected to the sensor electrodes 12a to 12d, and the sensor electrodes 12a to 12d are individually connected to an external circuit device via the lead wirings 121a to 121d.

The first shield portion 13 of the present embodiment is disposed over almost the entire area of the region B of the insulating substrate 11 except for the periphery of the sensor electrodes 12a to 12d and the periphery of the lead wirings 121a to 121d. The first shield portion 13 has a mesh shape as shown in the FIG. 9, however the first shield portion 13 is not particularly limited to this shape and may have a solid pattern. The lead wiring 135 is connected to the first shield portion 13, and the first shield portion 13 is connected to the ground or a constant potential via the lead wiring 135.

Although not particularly shown, the shape of the first shield portion 13 may be four frame shapes that individually surround the sensor electrodes 12a to 12d. In this case, the four frame-shaped first shield portions are arranged to respectively face the detecting electrodes 14a to 14d.

The detecting electrodes 14a and 14b are arranged at both ends of the region A of the insulating substrate 11 in the Y direction in the figure. Each of the detecting electrodes 14a and 14b has a rectangular frame-like shape having an opening 142. The opening 142 of the detecting electrode 14a has a size that encompasses the outer shape of the sensor electrode 12a, and the opening 142 of the detecting electrode 14b also has a size that encompasses the outer shape of the sensor electrode 12b. Then, in a state of folding the insulating substrate 11 at the bent portion F, the opening 142 of the detecting electrode 14a faces the sensor electrode 12a, and the opening 142 of the detecting electrode 14b faces the sensor electrode 12b.

Two lead wirings 141a and 141b are respectively connected to the detecting electrodes 14a and 14b. The detecting electrodes 14a and 14b are individually connected to the external circuit device via the lead wirings 141a and 141b.

Similarly, the detecting electrodes 14c and 14d are arranged at both ends of the region C of the insulating substrate 11 in the Y direction in the figure. Each of the detecting electrodes 14c and 14d has a rectangular frame-like shape having an opening 142. The opening 142 of the detecting electrode 14c has a size that encompasses the outer shape of the sensor electrode 12c, and the opening 142 of the detecting electrode 14d also has a size that encompasses the outer shape of the sensor electrode 12d. Then, in a state of folding the insulating substrate 11 at the bent portion F, the opening 142 of the detecting electrode 14c faces the sensor electrode 12c, and the opening 142 of the detecting electrode 14d faces the sensor electrode 12d.

Two lead wirings 141c and 141d are respectively connected to the detecting electrodes 14c and 14d. The detecting electrodes 14c and 14d are individually connected to the external circuit device via the lead wirings 141c and 141d.

The sensor electrodes 12a to 12d, the first shield portion 13, and the detecting electrodes 14a to 14d described above are formed by the same material and manufacturing method as the sensor electrode 12, the first shield portion 13, and the detecting electrode 14 described in the first embodiment.

Similar to the first embodiment, by folding one of the bent portions F, the region A and the region B overlap each other through the spacer 15, and the detecting electrodes 14a and 14b face parts 136 (the facing portions 136) of the first shield portions 13. Similarly, by folding the other bent portion F, the region C and the region B overlap each other through the spacer 15, and the detecting electrodes 14c and 14d face parts 136 (the facing portions 136) of the first shield portion 13. The sensor device 1G is assembles by such folding actions. Although not particularly shown, similar to FIG. 1B of the first embodiment, in this state, the sensor electrodes 12a to 12d and the first shield portion 13 are disposed on the first surface 15a, whereas the detecting electrodes 14a to 14d and the second shield portions 20 are disposed on the second surface 15b.

In the present embodiment, the flat plate-shaped spacer 15 is disposed only in the portion corresponding to the detecting electrodes 14a to 14d and is not disposed in the entire region A (region C). However, the arrangement of the spacer 15 is not particularly limited to this, and the spacer 15 may be disposed over the entire region A (region C). The shape of the spacer 15 is not particularly limited to the above, and the shape of the spacer 15 may be a frame shape corresponding to the detecting electrodes 14a to 14d.

In the present embodiment, the sensor electrodes 12a to 12d and the first shield portion 13 form the touch sensor TS. Further, in the present embodiment, the detecting electrodes 14a to 14d and the facing portions 136 of the first shield portion 13 form a pressure-sensitive sensor.

The first surface 15a provided with the first shield portion 13 is located closer to the operating surface of the sensor device 1G than the second surface 15b provided with the detecting electrodes 14a to 14d. As a result, it is possible to block the capacitive coupling between the operator FIN and the detecting electrode 14a to 14d, and the first shield portion 13 functions as a blocking body for preventing erroneous detection of the pressure-sensitive sensor due to the approach of the operator FIN.

As described above, in the present embodiment, since the first shield portion 13 functions both as one electrode of the pressure-sensitive sensor and as a blocking body, it is possible to suppress the increase in the number of parts of the sensor device 1G. Therefore, it is possible to reduce the total thickness of the sensor device 1G and to suppress the cost increase of the sensor device 1G.

Further, in the present embodiment, since the four detecting electrodes 14a to 14d are arranged to respectively correspond to the four sensor electrodes 12a to 12d, it is possible to detect the pressing force for each of the individual sensor electrodes 12a to 12d.

Eighth Embodiment

Figure 10:
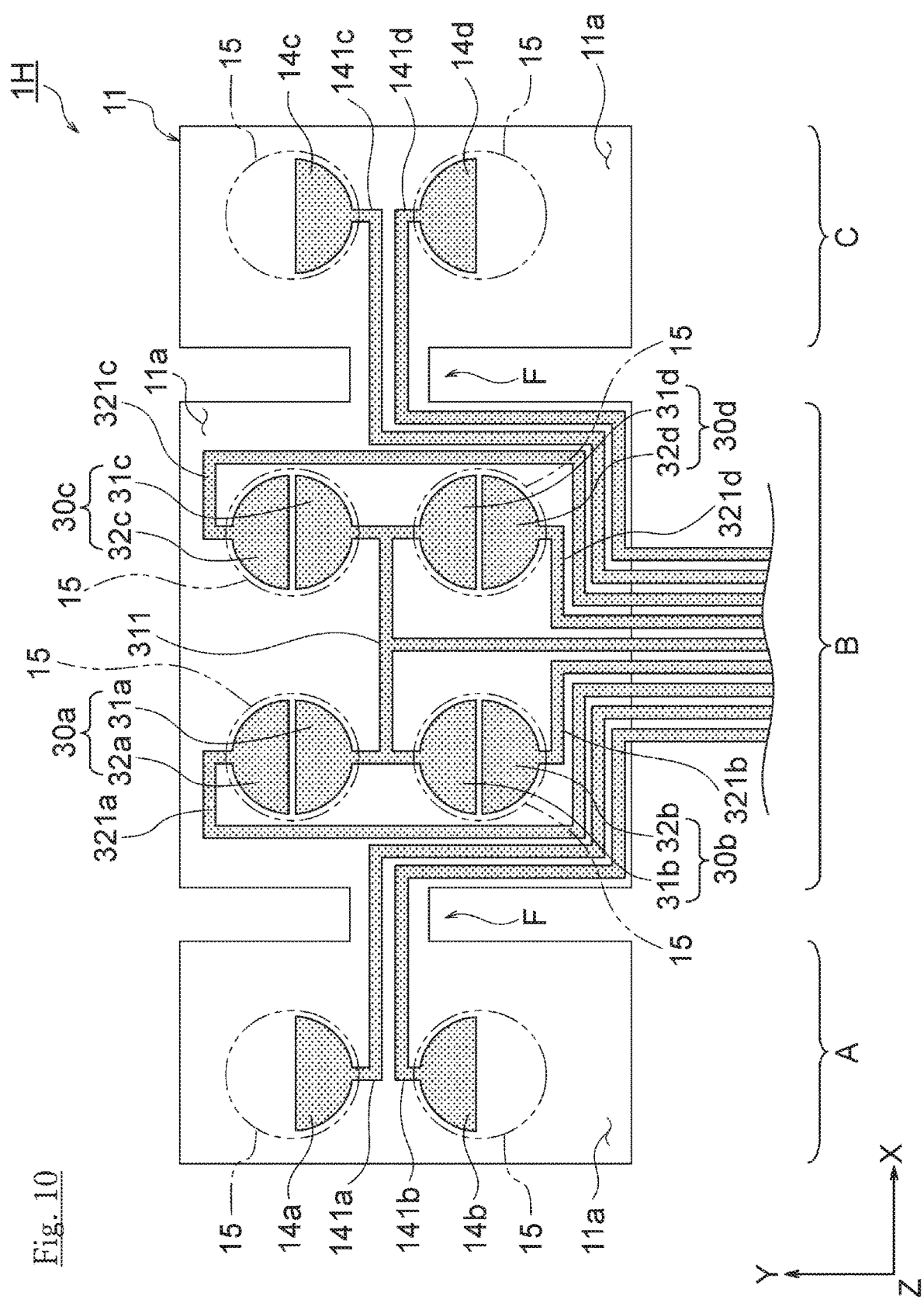
FIG. 10 is an expansion plan view illustrating the sensor device in the eighth embodiment of the present invention.

FIG. 10 is an expansion plan view illustrating the sensor device in the eighth embodiment of the present invention.

The present embodiment is different from the seventh embodiment in that (a) the touch sensor TS is a mutual capacitance type capacitance sensor, (b) the first shield portion 13 is not provided, and (c) the shape of each of the detecting electrodes 14a to 14d is a semicircular shape. Hereinafter, only differences between the sensor device 1H in the eighth embodiment and the seventh embodiment will be described, and portions having the same configurations as those in the seventh embodiment will be denoted by the same reference numerals, and descriptions thereof will be omitted.

Similar to the sensor electrodes 30a to 30c described in the third embodiment, the four sensor electrodes 30a to 30d are respectively composed of input electrodes 31a to 31d and receiving electrodes 32a to 32d that are arranged to be adjacent to each other. One lead wiring 311 is branched and connected to the four input electrodes 31a to 31d. The input electrodes 31a to 31d are connected to an external circuit device (not shown) via the lead wiring 311. On the other hand, four lead wirings 321a to 321d are respectively connected to the four receiving electrodes 32a to 32d. The receiving electrodes 32a to 32d are individually connected to the external circuit device via the lead wirings 321a to 321d.

The detecting electrodes 14a to 14d of the present embodiment have semicircular shapes respectively corresponding to the input electrodes 31a to 31d. In a state in which the insulating substrate 11 is folded at the bent portion F, the detecting electrodes 14a to 14d respectively face the input electrodes 31a to 31d. Although not particularly shown, similar to the FIG. 1B of the first embodiment, in this state, the sensor electrodes 30a to 30d are provided on the first surface 15a, whereas the detecting electrodes 14a to 14d are provided on the second surface 15b. The detecting electrodes 14a to 14d may be smaller than the input electrodes 31a to 31d so that the detecting electrodes 14a to 14d are covered with the input electrodes 31a to 31d.

In the present embodiment, the sensor electrodes 30a to 30d form the touch sensor TS. Further, in the present embodiment, the detecting electrodes 14a to 14d and the input electrodes 31a to 31d form a pressure-sensitive sensor.

The first surface 15a provided with the input electrodes 31a to 31d is located closer to the operating surface of the sensor device 1H than the second surface 15b provided with the detecting electrodes 14a to 14d, and a voltage is applied to the input electrodes 31a to 31d from the external circuit device. Therefore, since it is possible to block the capacitive coupling between the operator FIN and the detecting electrodes 14a to 14d, the input electrodes 31a to 31d function as a blocking body for preventing erroneous detection of the pressure-sensitive sensor due to the approach of the operator FIN.

As described above, in the present embodiment, since the input electrodes 31a to 31d functions both as one electrode of the pressure-sensitive sensor and as a blocking body, it is possible to suppress the increase in the number of parts of the sensor device 1H. Therefore, it is possible to reduce the total thickness of the sensor device 1H and to suppress the cost increase of the sensor device 1H.

Further, in the present embodiment, since the four detecting electrodes 14a to 14d are arranged to respectively correspond to the four sensor electrodes 30a to 30d, it is possible to detect the pressing force for each of the sensor electrodes 30a to 30d.

The above-described embodiment is used to facilitate the understanding of the invention and does not limit the invention. Thus, the components disclosed in the above-described embodiment include all modifications in design and equivalents belonging to the technical scope of the invention.

For example, in the first to seventh embodiments, the first shield portion 13 may be disposed in a portion other than the periphery of the sensor electrode in addition to the periphery of the sensor electrode of the insulating substrate 11. For example, when the sensor device includes an electrode pattern other than the sensor electrode (for example, a slider electrode, a wheel electrode, etc.) on the region B of the insulating substrate 11, the first shield portion 13 may be disposed at a position distant from the sensor electrode via an electrode pattern in addition to the periphery of the sensor electrode.

The sensor device 1H described in the eighth embodiment may include the first shield portion 13. The sensor devices 1A, 1C to 1E, 1G, and 1H described in the first, third to fifth, seventh, and eighth embodiments may include the second shield portion 20.

The sensor devices 1A to 1E, 1G, and 1H described in the first to fifth, seventh and eighth embodiments may include the spacer 15A shown in FIG. 7A and FIG. 7B or the spacer 15B shown in FIG. 8A and FIG. 8B.

EXPLANATIONS OF LETTERS OR NUMERALS 1A to 1H SENSOR DEVICE
11 INSULATING SUBSTRATE
12, 12a to 12d SENSOR ELECTRODE
121a to 121d LEAD WIRING
13 FIRST SHIELD PORTION
13a to 13c REGION
131, 133, 134 SHIELD ELECTRODE
132 SHIELD WIRING
135 LEAD WIRING
136 FACING PORTION
137 SLIT
14, 14a to 14d DETECTING ELECTRODE
141, 141a to 141d LEAD WIRING
142 OPENING
15, 15a to 15d SPACER
151, 152 OPENING
15a FIRST SURFACE
15b SECOND SURFACE
16, 16a to 16c LED
17 COVER PANEL
18 BASE MEMBER
20 SECOND SHIELD PORTION
30a to 30d SENSOR ELECTRODE
31a to 31d INPUT ELECTRODE
311 LEAD WIRING
31a to 31d RECEIVING ELECTRODE
321a to 321d LEAD WIRING
40a to 40d BLOCKING ELECTRODE
41 LEAD WIRING
50 SUPPORT MEMBER
51 CUSHION MEMBER
R PREDETERMINED REGION
F BENT PORTION
L1, L2 BENDING LINE
FIN OPERATOR
VF VIRTUAL FRAME

The invention claimed is:

1. A sensor device including an operation surface on which an input operation is performed, the sensor device comprising:
    an insulating substrate;
    a touch sensor that comprises sensor electrodes formed on one main surface of the insulating substrate;
    a blocking body that is disposed on the one main surface;
    a detecting electrode that is disposed to face the blocking body; and
    a spacer that keeps a space between the blocking body and the detecting electrode, the spacer including a first surface and a second surface located opposite to the first surface,
    wherein
    the first surface is located closer to the operation surface than the second surface,
    the detecting electrode is disposed on the second surface,
    the blocking body and the detecting electrode constitute a pressure-sensitive sensor that detects a change in capacitance value caused by approaching of the blocking body and the detecting electrode,
    the blocking body blocks capacitive coupling between an operator and the detecting electrode caused by approaching of the operator to the operation surface,
    the touch sensor further comprises a first shield portion that is disposed on the one main surface,
    at least a part of the first shield portion is formed in at least a part of a periphery of the sensor electrode, and
    the blocking body is included in the first shield portion,
    the first shield portion is separated from the sensor electrode and surrounds the sensor electrode,
    the first shield portion comprises a shield wiring disposed between the sensor electrodes.

2. The sensor device according to claim 1, wherein
    the sensor electrode includes an input electrode and a receiving electrode that are arranged to be adjacent to each other, and the blocking body is connected to the input electrode or is included in the input electrode.

3. The sensor device according to claim 1, wherein the sensor device further comprises a spacer that keeps a space between the blocking body and the detecting electrode, and
the blocking body and the detecting electrode are accessible to each other in response to a pressing of the operator.

4. The sensor device according to claim 3, wherein the spacer is an elastic body that is disposed between the blocking body and the detecting electrode.

5. The sensor device according to claim 3, wherein the spacer has an opening that is interposed between the blocking body and the detecting electrode.

6. The sensor device according to claim 1, wherein the blocking body covers the detecting electrode in a plan view.

7. The sensor device according to claim 1, wherein the detecting electrode is filled with a conductive material.

8. The sensor device according to claim 1, wherein the sensor device further comprises a second shield portion that is formed on at least a part of a periphery of the detecting electrode.

9. The sensor device according to claim 1, wherein the detecting electrode is formed at a position outside the sensor electrode and the blocking body and interposing a predetermined region in the insulating substrate, and
the detecting electrode is disposed to face the blocking body by bending the predetermined region.

10. The sensor device according to claim 1, wherein the touch sensor comprises a plurality of the sensor electrodes,
the sensor device comprises a plurality of the detecting electrodes, and
the plurality of detecting electrodes are arranged around the plurality of sensor electrodes in a plan view.

11. The sensor device according to claim 10, wherein the plurality of sensor electrodes are disposed inside a virtual frame that encompasses the plurality of detecting electrodes and that contacts the plurality of detecting electrodes in a plan view.

12. The sensor device according to claim 1, wherein the touch sensor comprises a plurality of the sensor electrodes,
the sensor device comprises a plurality of the detecting electrodes, and
the plurality of detecting electrodes are arranged to respectively correspond to the plurality of sensor electrodes in a plan view.

13. The sensor device according to claim 1, wherein the touch sensor comprises a first shield portion that has a slit extending linearly, and
the sensor device comprises a lead wiring that is connected to the detecting electrode and passes the first shield portion through the slit.

14. The sensor device according to claim 1, wherein the first shield portion is connected to a ground or a constant potential.

15. The sensor device according to claim 1, wherein the one main surface of the insulating substrate faces the first surface.

* * * * *